(12) United States Patent
Dehe et al.

(10) Patent No.: US 10,779,101 B2
(45) Date of Patent: Sep. 15, 2020

(54) MEMS DEVICE

(71) Applicant: Infineon Technologies AG, Neubiberg (DE)

(72) Inventors: Alfons Dehe, Villingen Schwenningen (DE); Stefan Barzen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/787,577

(22) Filed: Feb. 11, 2020

(65) Prior Publication Data

US 2020/0236485 A1   Jul. 23, 2020

Related U.S. Application Data

(60) Division of application No. 16/200,072, filed on Nov. 26, 2018, now Pat. No. 10,602,290, which is a division of application No. 15/452,058, filed on Mar. 7, 2017, now Pat. No. 10,171,925, which is a continuation of application No. 14/275,337, filed on May 12, 2014, now Pat. No. 9,628,886.

(60) Provisional application No. 61/870,112, filed on Aug. 26, 2013.

(51) Int. Cl.
| | |
|---|---|
| *H04R 31/00* | (2006.01) |
| *B81B 3/00* | (2006.01) |
| *H04R 19/00* | (2006.01) |
| *H04R 1/08* | (2006.01) |
| *B81C 1/00* | (2006.01) |

(52) U.S. Cl.
CPC ......... *H04R 31/003* (2013.01); *B81B 3/0021* (2013.01); *B81B 3/0086* (2013.01); *B81C 1/00158* (2013.01); *H04R 1/08* (2013.01); *H04R 19/005* (2013.01); *H04R 31/006* (2013.01); *B81B 2201/0221* (2013.01); *B81B 2201/0257* (2013.01); *B81B 2203/0127* (2013.01); *B81B 2203/04* (2013.01); *B81C 2201/013* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 7,668,323 B2 | 2/2010 | Miyazaki | |
| 2008/0104825 A1 | 5/2008 | Dehe et al. | |
| 2009/0060232 A1 | 3/2009 | Hirade et al. | |
| 2012/0148071 A1* | 6/2012 | Dehe | H04R 1/005 381/116 |
| 2012/0319217 A1* | 12/2012 | Dehe | H04R 19/04 257/415 |

(Continued)

FOREIGN PATENT DOCUMENTS

| | | |
|---|---|---|
| CN | 1753576 A | 3/2006 |
| CN | 1942022 A | 4/2007 |

(Continued)

*Primary Examiner* — Paul W Huber
(74) *Attorney, Agent, or Firm* — Slater Matsil, LLP

(57) ABSTRACT

A MEMS device includes a backplate electrode and a membrane disposed spaced apart from the backplate electrode. The membrane includes a displaceable portion and a fixed portion. The backplate electrode and the membrane are arranged such that an overlapping area of the fixed portion of the membrane with the backplate electrode is less than maximum overlapping.

20 Claims, 25 Drawing Sheets

(56) References Cited

U.S. PATENT DOCUMENTS

| | | |
|---|---|---|
| 2012/0326249 A1 | 12/2012 | Rombach |
| 2013/0277771 A1 | 10/2013 | Chou et al. |

FOREIGN PATENT DOCUMENTS

| | | |
|---|---|---|
| CN | 101365258 A | 2/2009 |
| CN | 101406069 A | 4/2009 |
| CN | 101409856 A | 4/2009 |
| JP | 2007228345 A | 9/2007 |
| JP | 2009065606 A | 3/2009 |
| KR | 100737405 B1 | 7/2007 |

\* cited by examiner

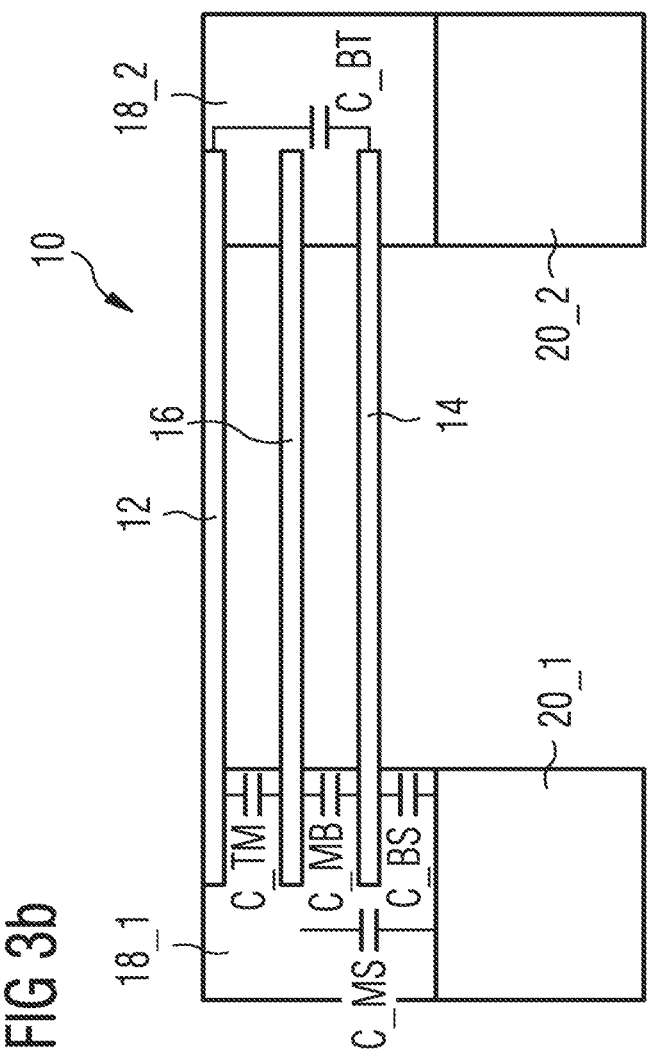
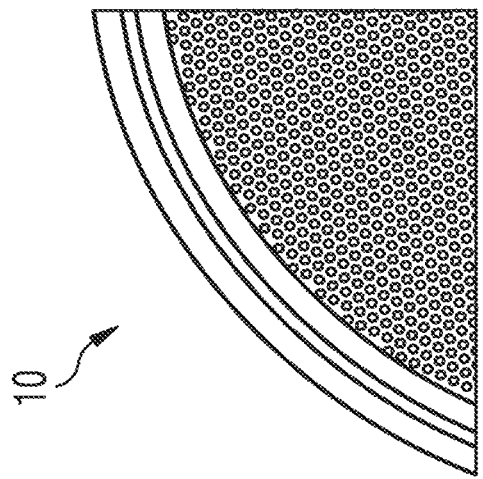

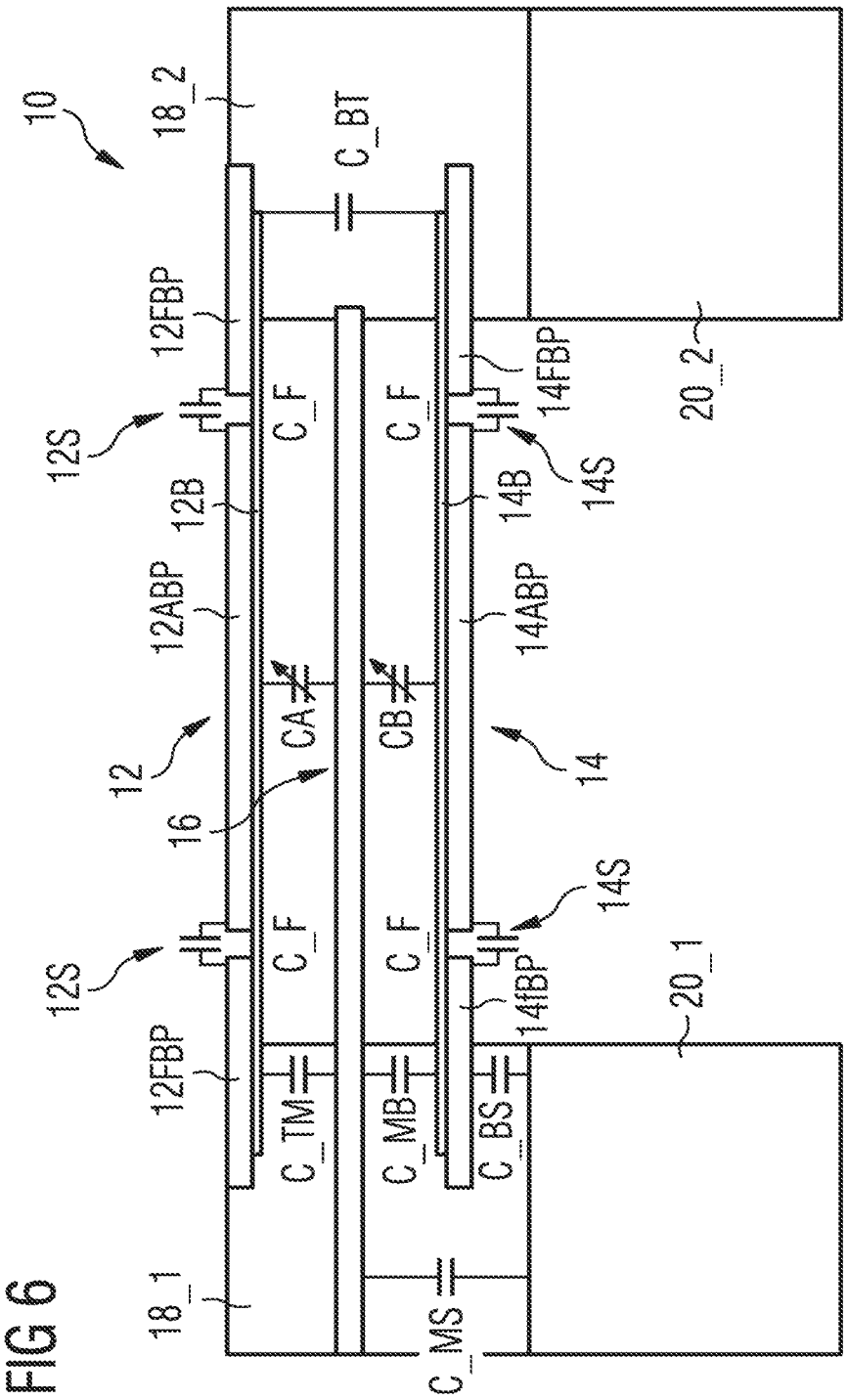

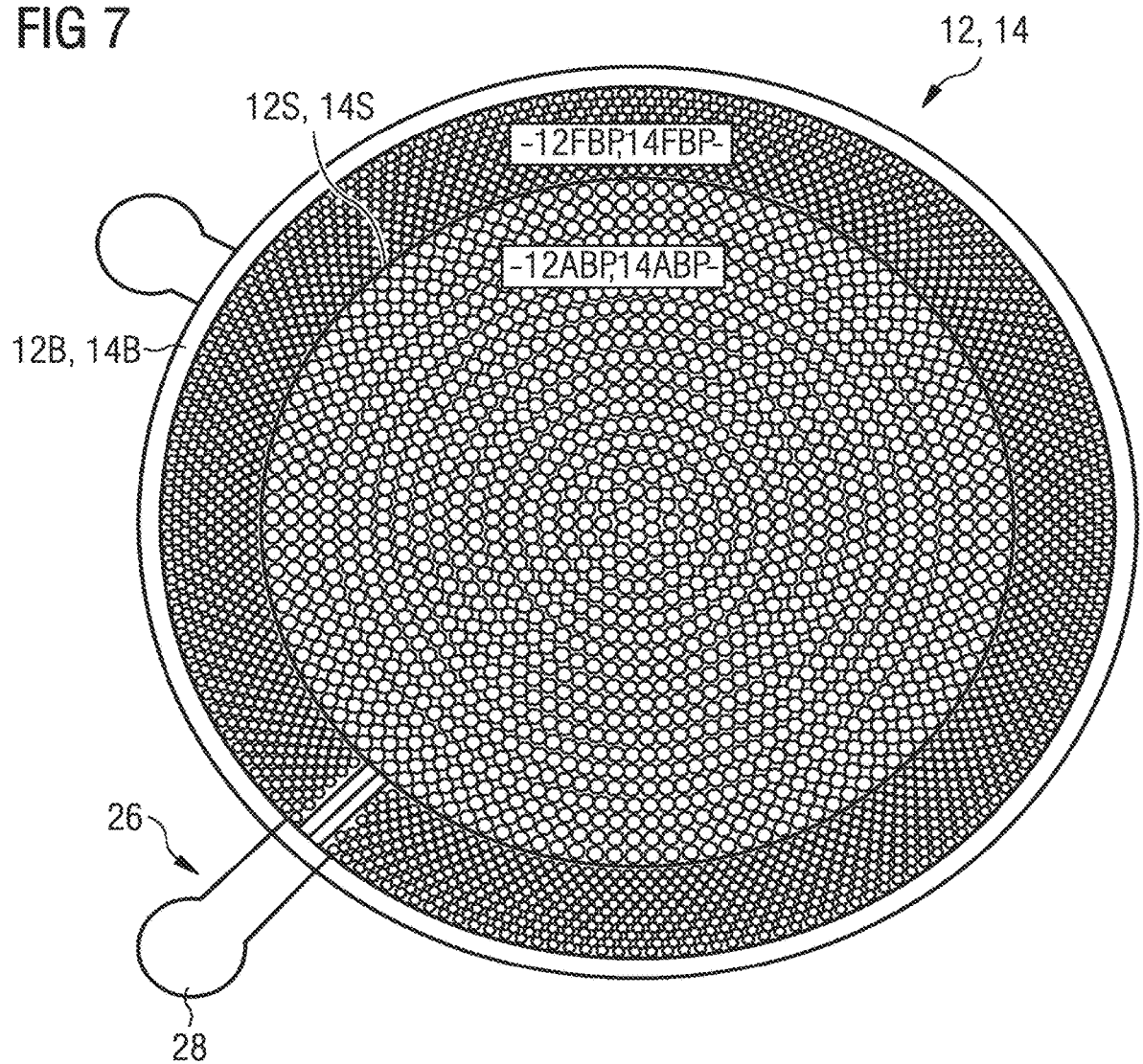

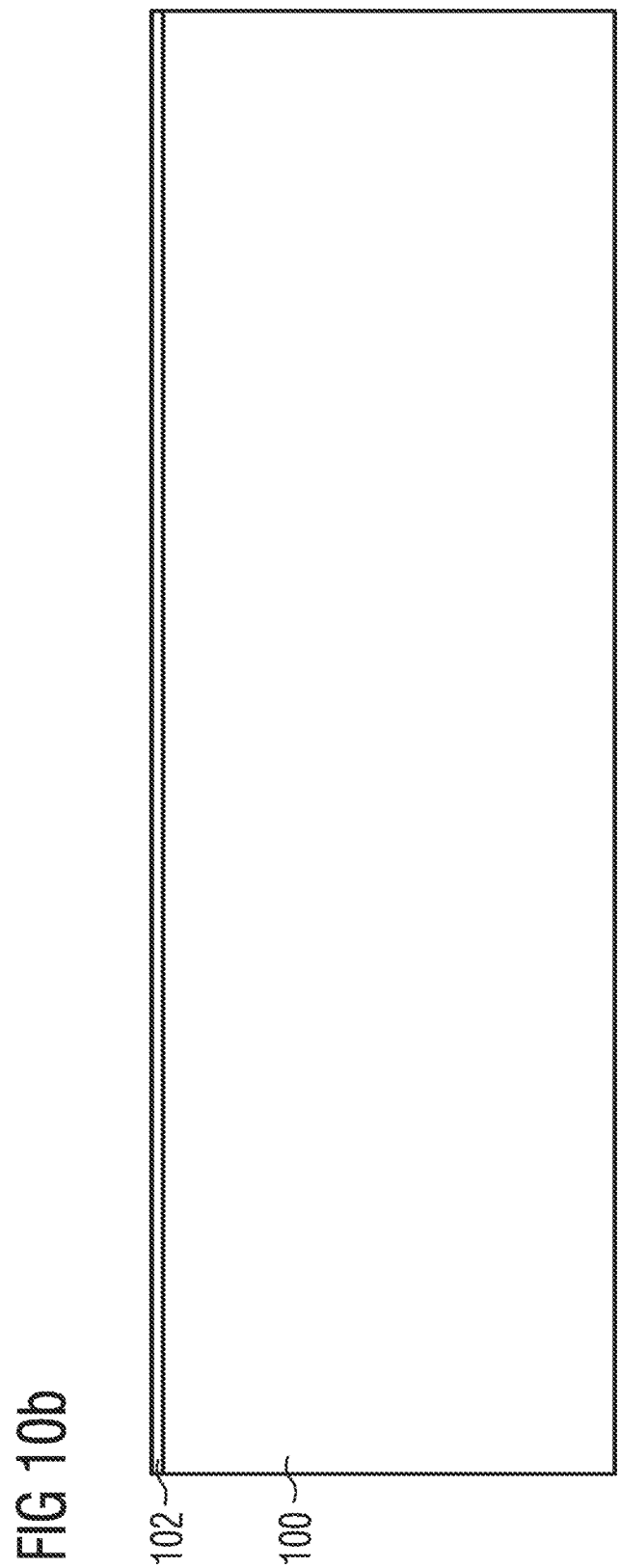

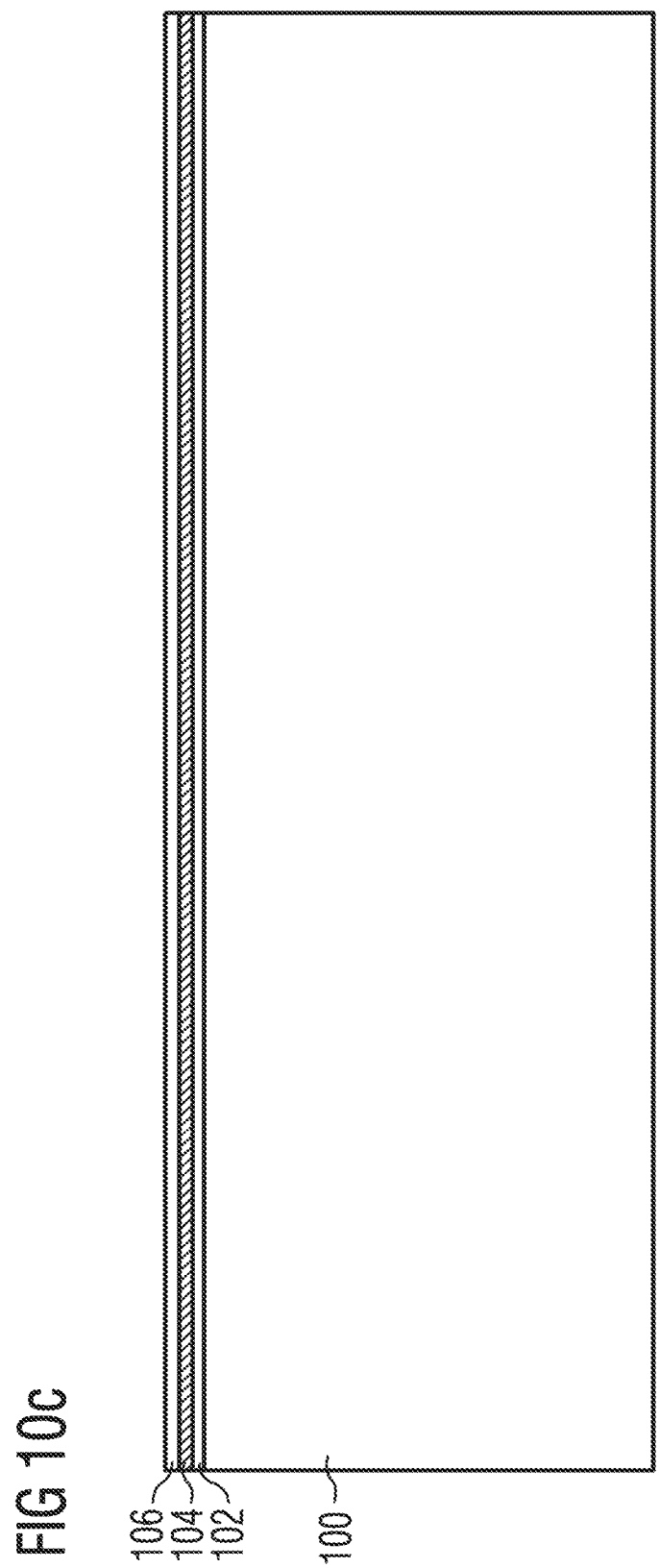

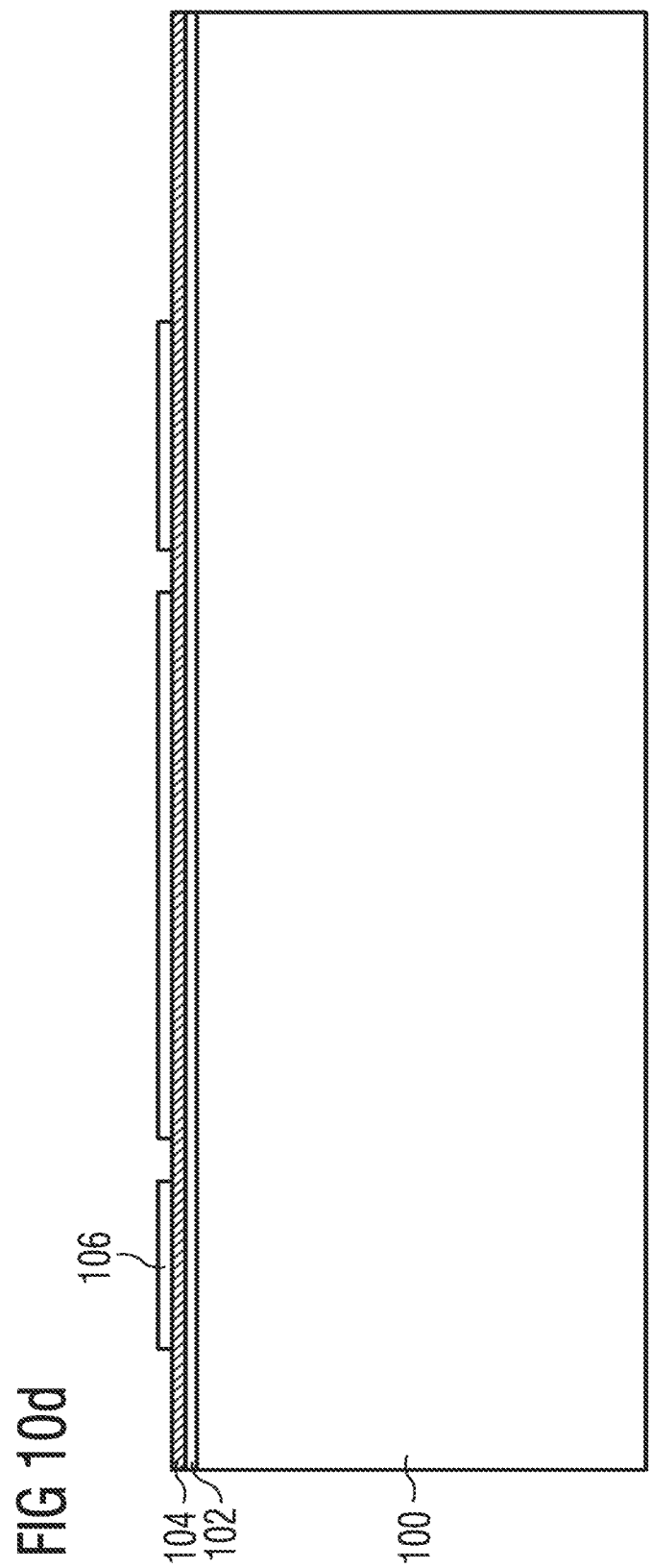

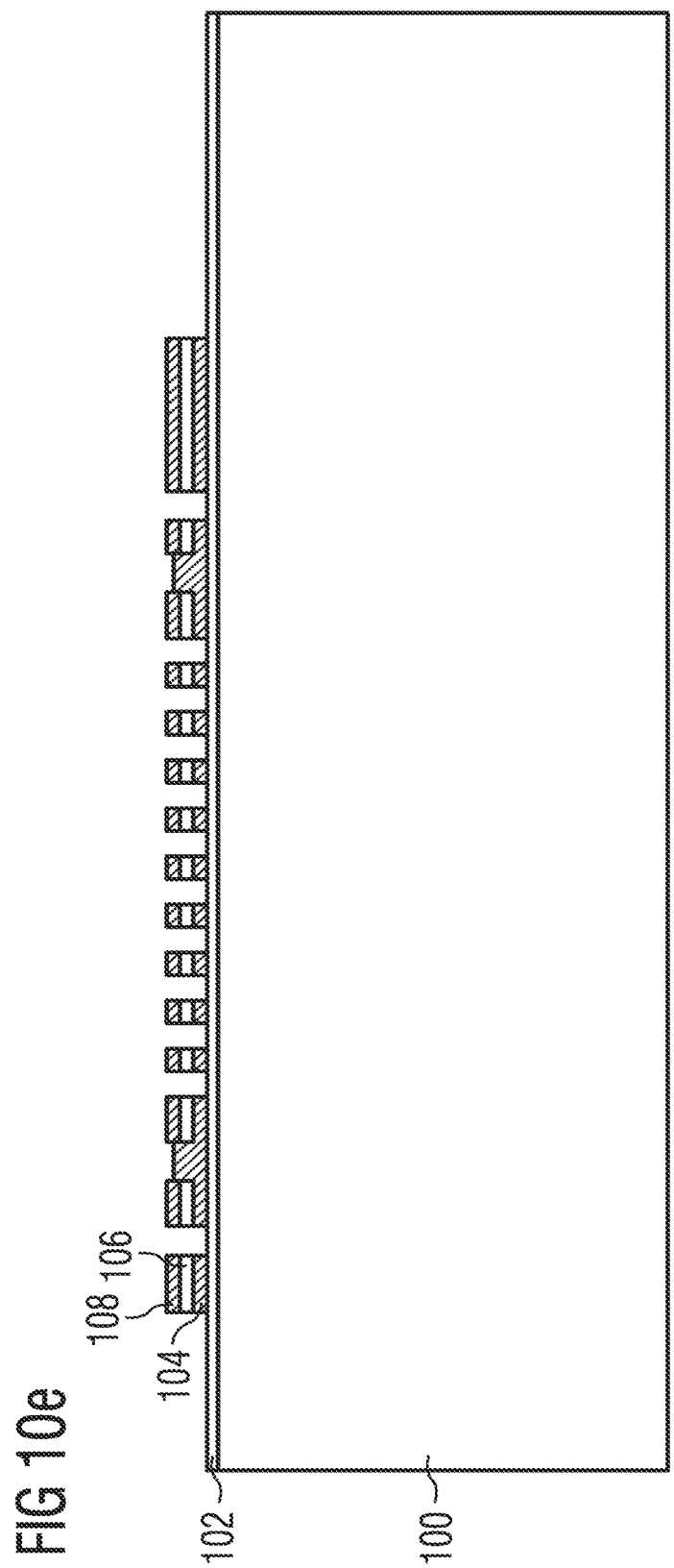

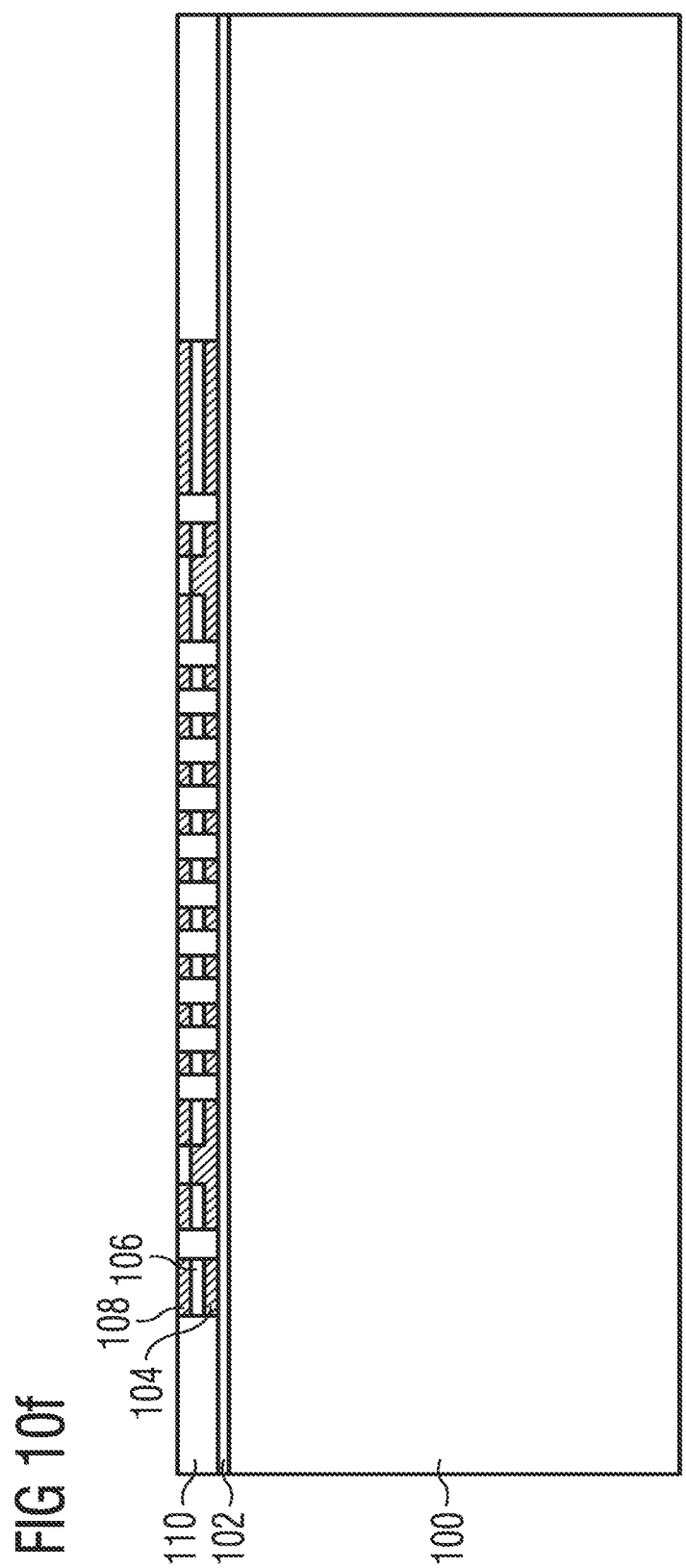

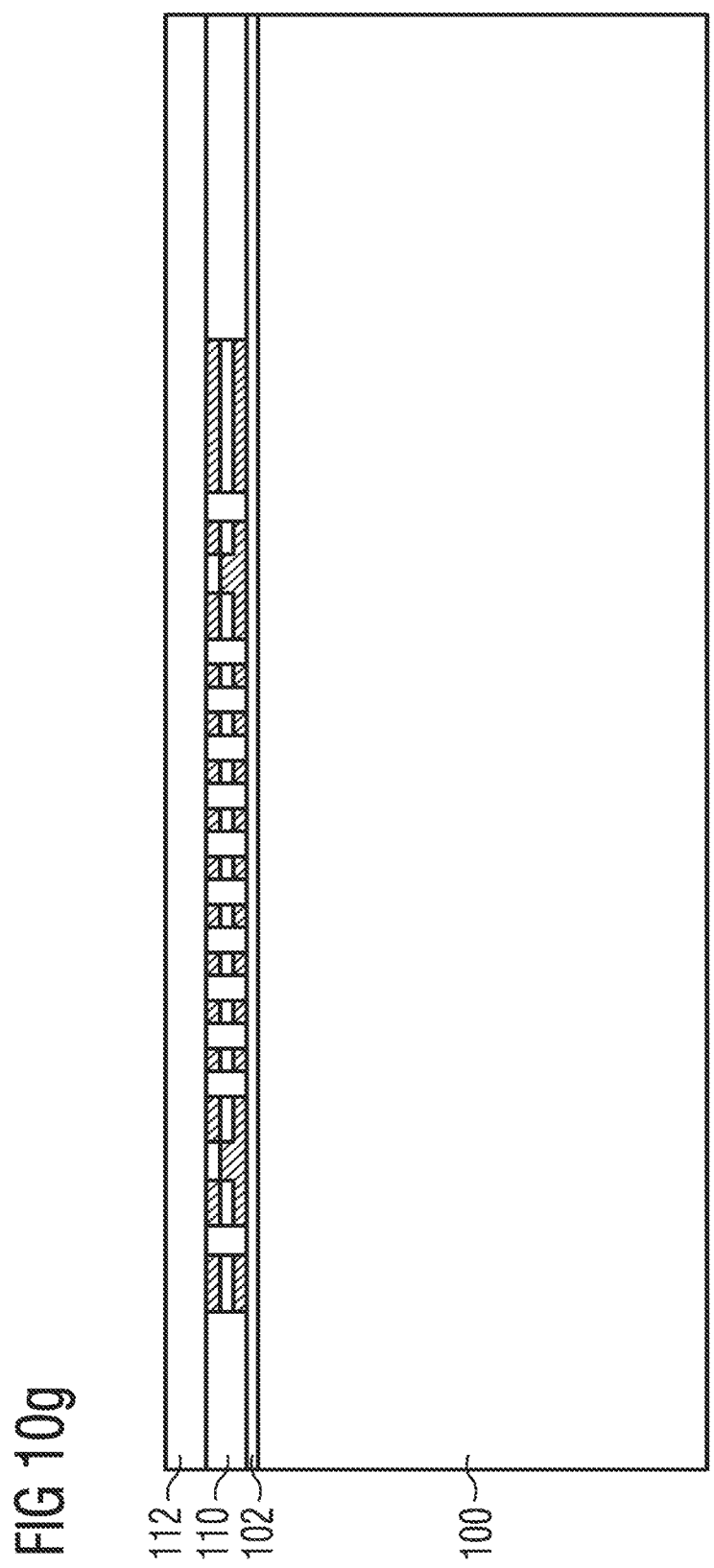

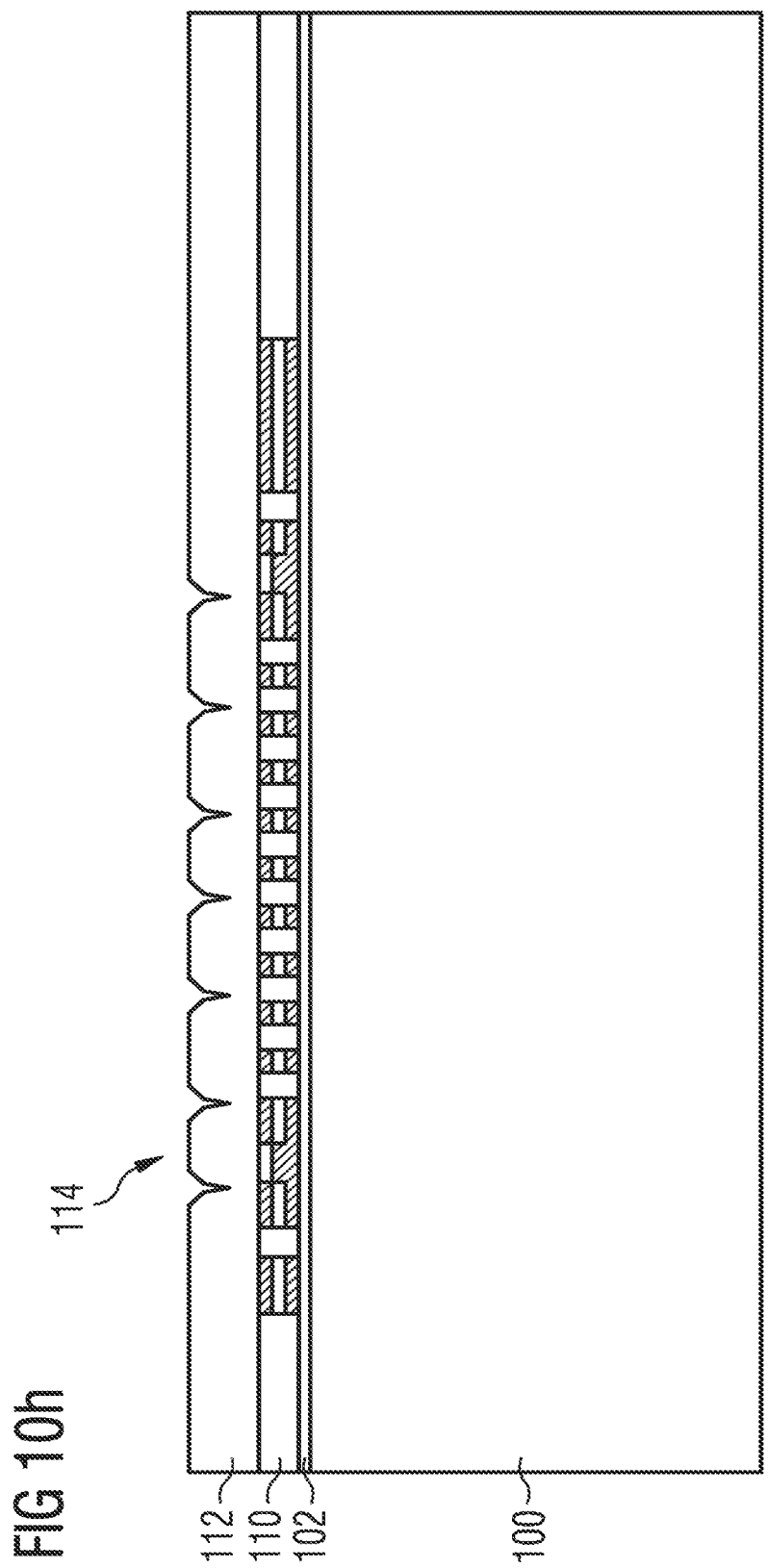

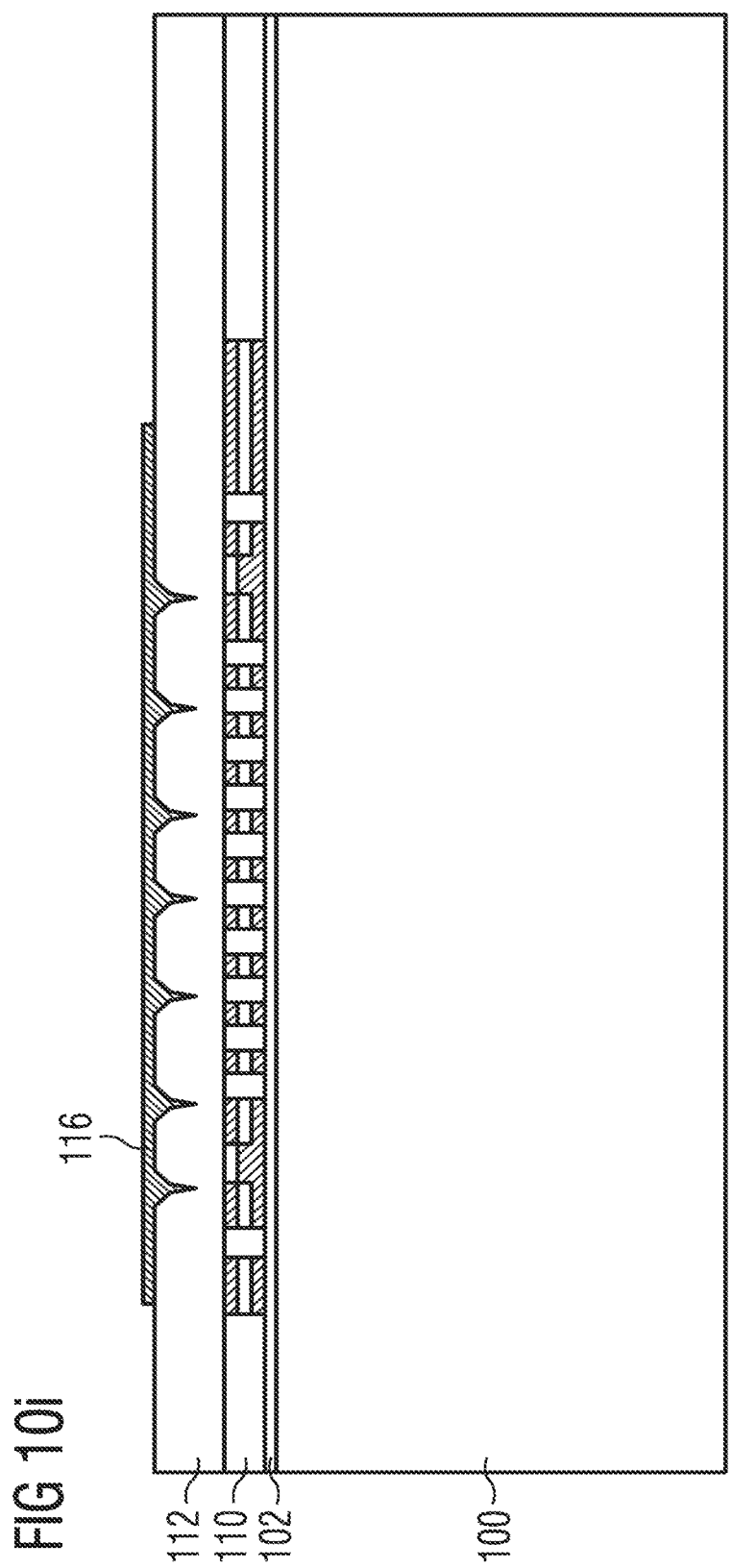

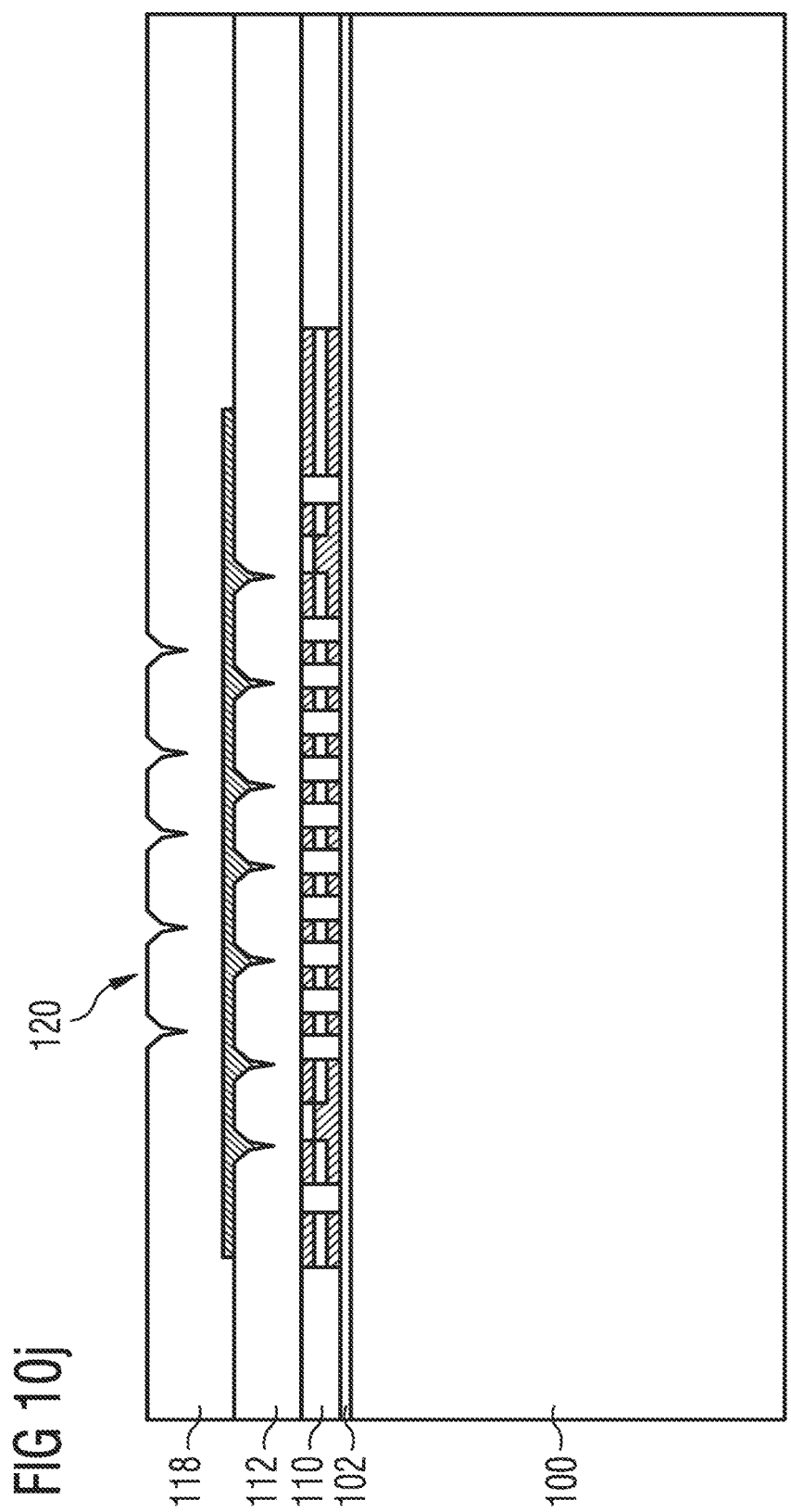

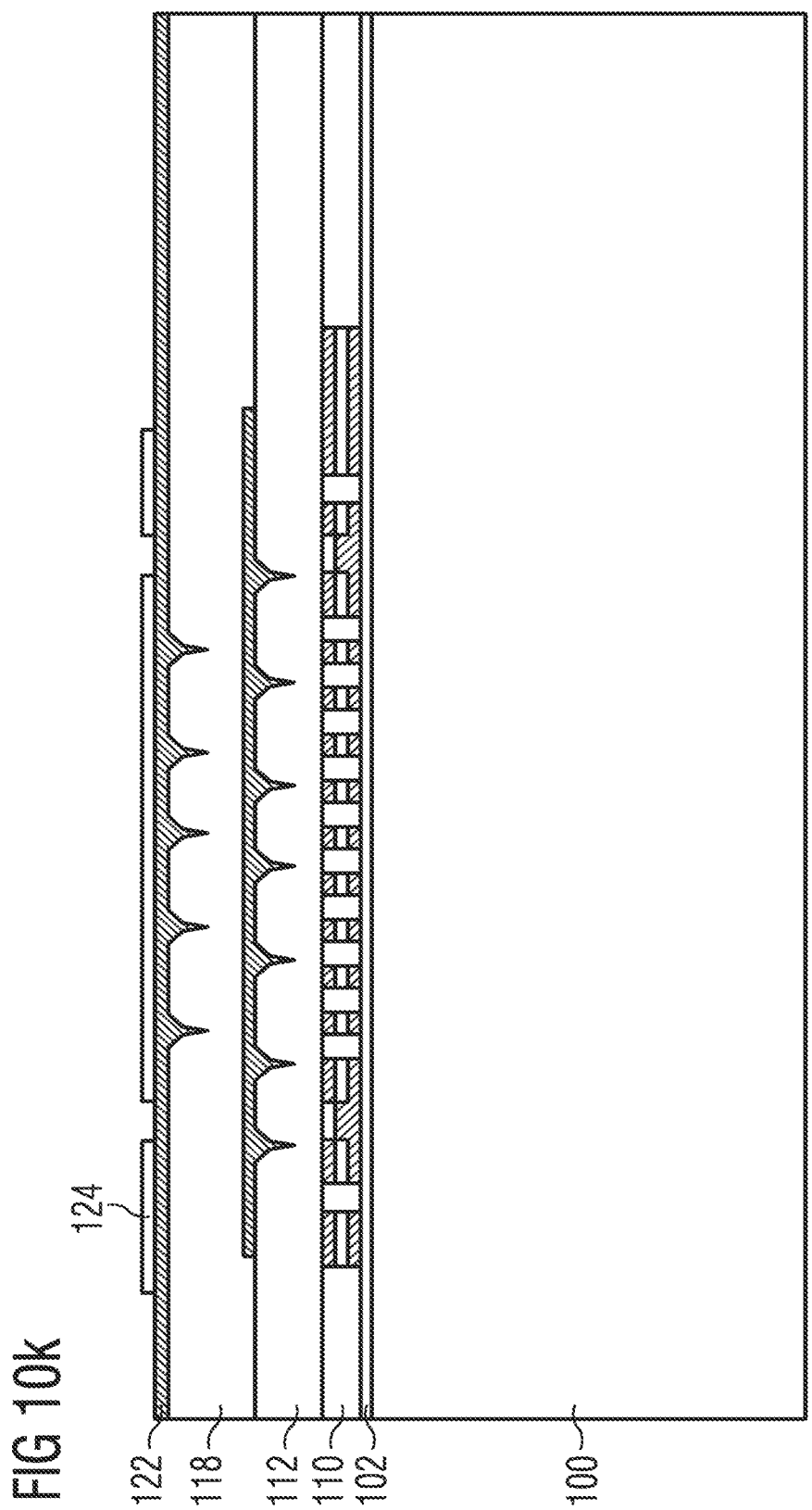

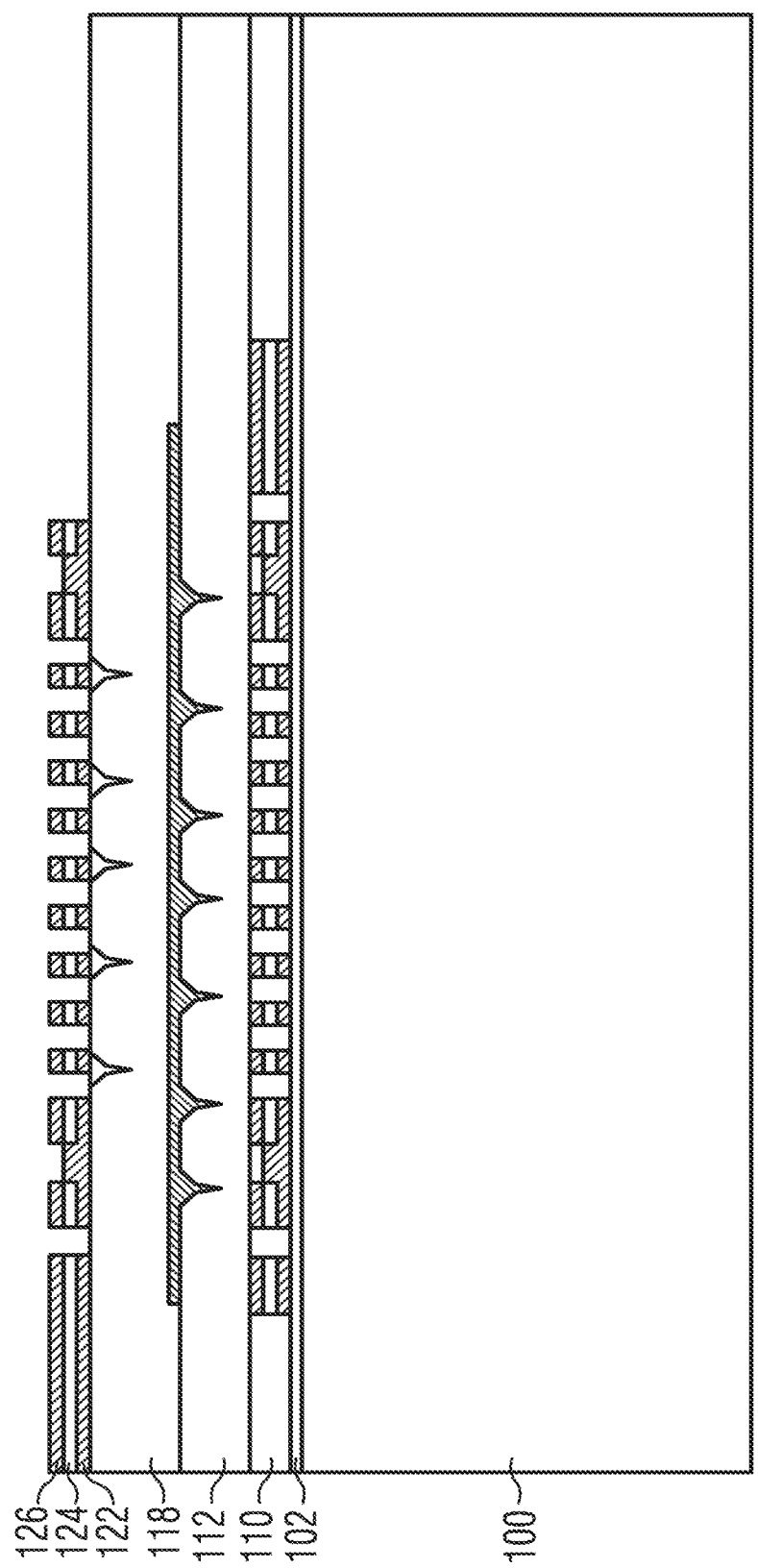

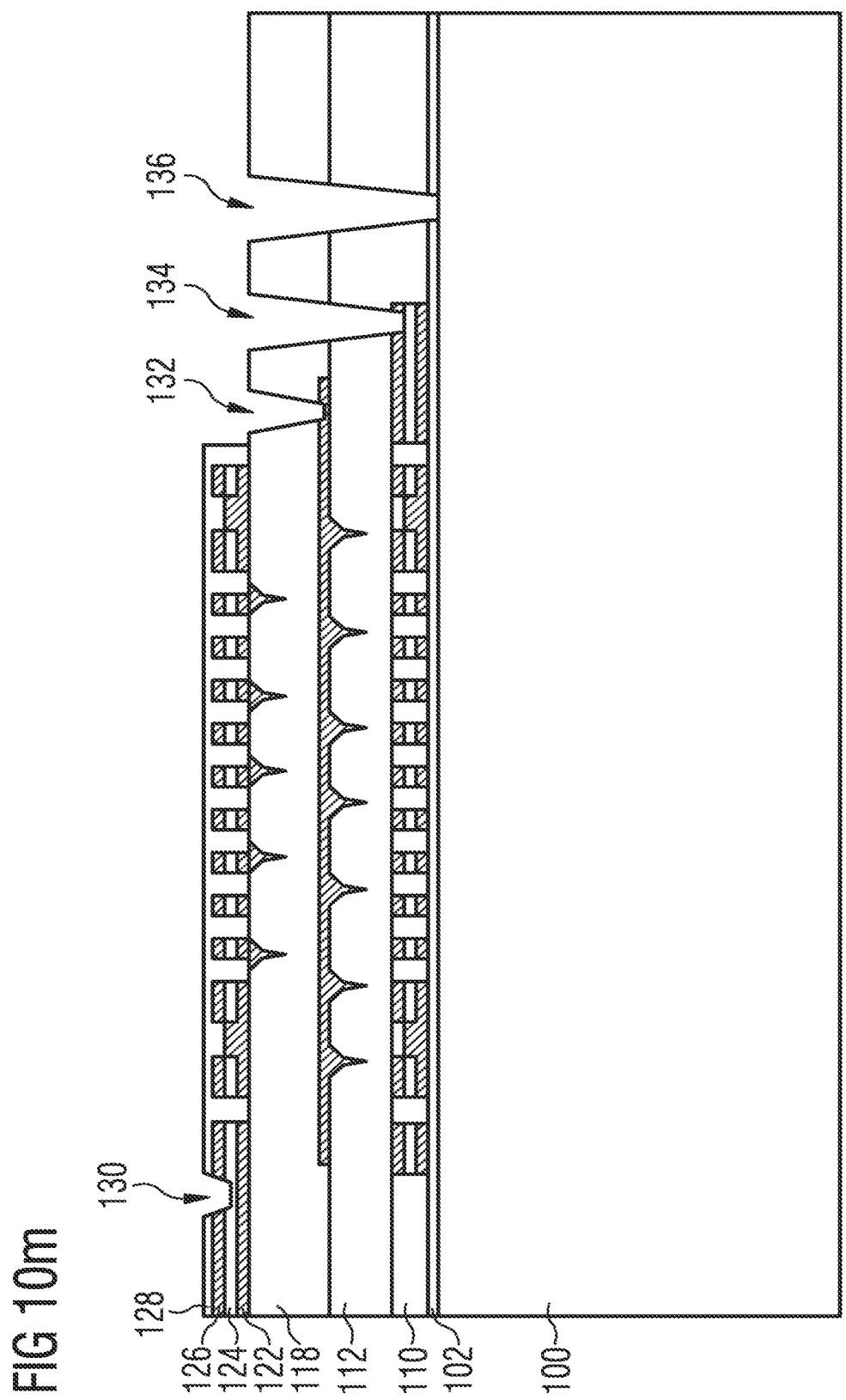

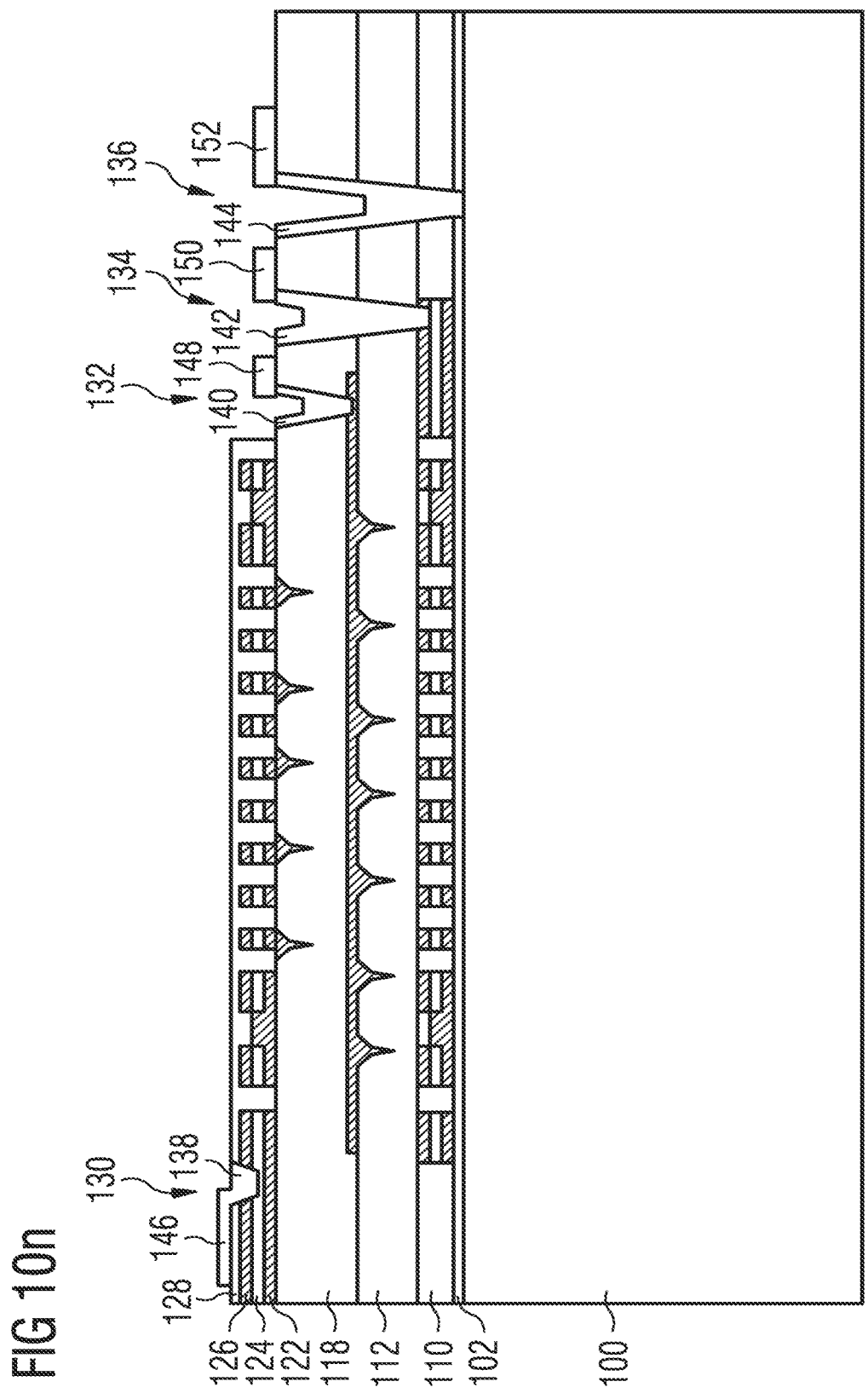

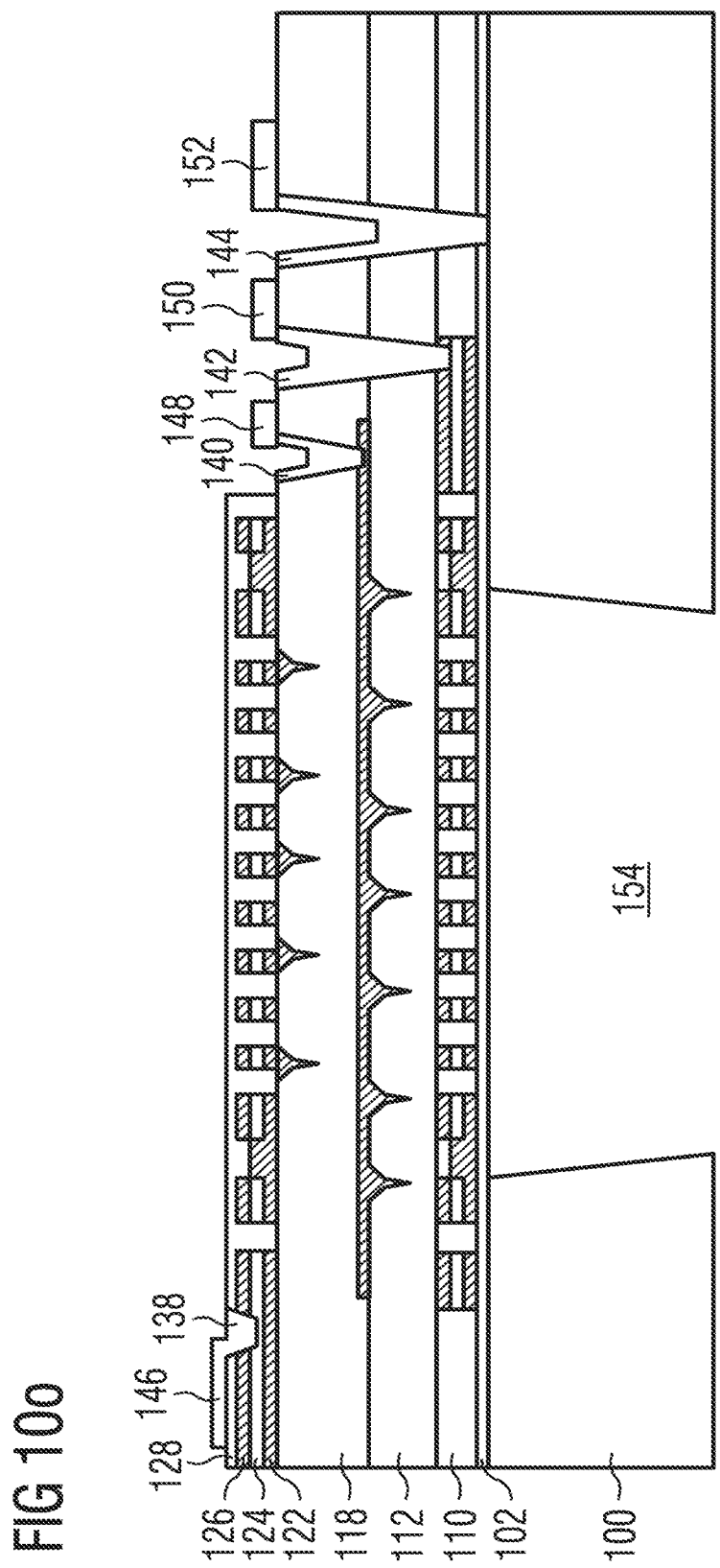

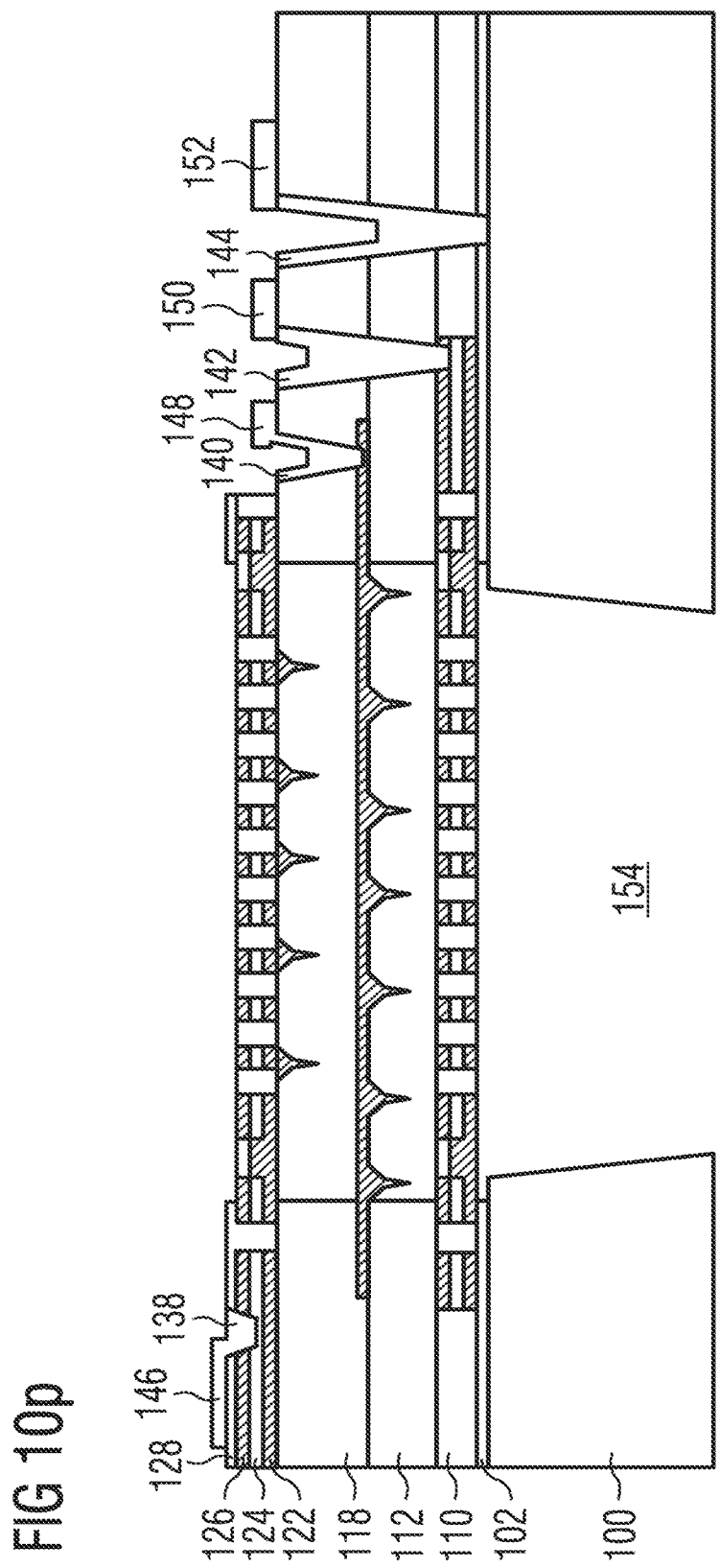

MEMS DEVICE

This application is a divisional of U.S. patent application Ser. No. 16/200,072, filed Nov. 26, 2018, which application is a divisional of U.S. patent application Ser. No. 15/452,058, filed Mar. 7, 2017, now U.S. Pat. No. 10,171,925, which is a continuation of U.S. patent application Ser. No. 14/275,337, filed on May 12, 2014, now U.S. Pat. No. 9,628,886, which application claims the benefit of U.S. Provisional Application No. 61/870,112 filed Aug. 26, 2013, which applications are hereby incorporated herein by reference in their entirety.

TECHNICAL FIELD

Embodiments of the invention refer to a MEMS device, to an electrostatic transducer and to a method for manufacturing a MEMS device.

BACKGROUND

A double backplate microphone in MEMS device technology comprises a top backplate electrode and a bottom backplate electrode being arranged in parallel to each other, and a membrane being disposed between the top backplate electrode and bottom backplate electrode in parallel. The top backplate electrode, bottom backplate electrode and membrane are supported by a support structure. This arrangement is supported by a substrate.

In order to transmit sound pressure waves, for example speech, to the membrane interposed between the top backplate electrode and bottom backplate electrode, these electrodes may be perforated. Sound pressure waves cause the membrane to vibrate due to a pressure difference over both planes of the membrane. Hence, the air gap between the membrane and each of the backplate electrodes varies. The backplate electrodes and the membrane may comprise electrically conductive material(s). The variation of the membrane in relation to the backplate electrodes causes variation in the capacitances between the membrane and the bottom backplate electrode as well as between the membrane and the top backplate electrode. This variation in the capacitances is transformed into an output signal responsive to the movement of the membrane. The membrane may be biased by a bias voltage relative to the bottom backplate electrode and the top backplate electrode.

The double backplate microphone as described above schematically, suffers from parasitic capacitances, created inside the support structure. A first parasitic capacitance can be created inside the support structure between the membrane and the top backplate electrode. A second parasitic capacitance can be created inside the support structure between the membrane and the bottom backplate electrode. A third parasitic capacitance can be created inside the support structure between the bottom backplate electrode and the substrate. The substrate can be grounded. In other words, parasitic capacitances tend to be created between the top backplate electrode, membrane and bottom backplate electrode in combination, inside the support structure, i.e., in portions of the MEMS device excluding the air gap between the membrane and the top backplate electrode, as well as the air gap between the membrane and the bottom backplate electrode.

Parasitic capacitances are usually unwanted capacitances interfering with capacitances between both the membrane and the top backplate electrode as well as between the membrane and the bottom backplate electrode. Hence, capacitance values, intended to be transformed into electrical signals responsive to the movement of the membrane are interfered. In case the MEMS device is embodied as a double backplate microphone, for example, parasitic capacitances may influence the MEMS device such that the (electrical) output does not correspond to a correct reproduction of the (audible) input. While not mentioned, further sources of parasitic capacitances are conceivable.

SUMMARY

An embodiment of the invention provides a MEMS device comprising a backplate electrode. A membrane is disposed spaced apart from the backplate electrode. The membrane comprises a displaceable portion and a fixed portion. The backplate electrode and the membrane are arranged such that an overlapping area of the fixed portion of the membrane with the backplate electrode is less than maximum overlapping.

A further embodiment provides an electrostatic transducer comprising a backplate electrode. A membrane is disposed spaced apart from the backplate electrode. The membrane comprises a displaceable portion and a fixed portion. The backplate electrode and the membrane are arranged such that an overlapping area of the fixed portion of the membrane with the backplate electrode is less than maximum overlapping. The electrostatic transducer is configured to produce an output signal responsive to a movement of the membrane in relation to the backplate electrode.

A further embodiment provides a method for manufacturing a MEMS device that comprises a backplate. A membrane is disposed spaced apart from the backplate electrode, wherein the membrane comprises a displaceable portion and a fixed portion. The method comprises providing the backplate electrode and the membrane such that an overlapping area of the fixed portion of the membrane with the backplate electrode is less than maximum overlapping.

BRIEF DESCRIPTION OF THE DRAWINGS

Embodiments of the present invention are described in the following with respect to the figures.

FIG. 1b shows a schematic circuit diagram of the MEMS device depicted in FIG. 1a;

FIG. 2b shows a schematic circuit diagram of the MEMS device depicted in FIG. 2a;

FIG. 3a shows a plan view of a MEMS device;

FIG. 3b shows a schematic cross-sectional view of the MEMS device depicted in FIG. 3a;

FIG. 4b shows a schematic cross-sectional view of the MEMS device depicted in FIG. 4a;

FIG. 5b shows a schematic cross-sectional view of the MEMS device depicted in FIG. 5a;

FIG. 6 shows a schematic diagram of a MEMS device in a cross-sectional view;

FIG. 7 shows a schematic plan view of a backplate electrode of the MEMS device;

FIG. 8b shows a schematic cross-sectional view of the MEMS device depicted in FIG. 8a;

FIGS. 10a-10p schematically illustrate a process flow of a method for manufacturing the MEMS device.

Figure 1A:
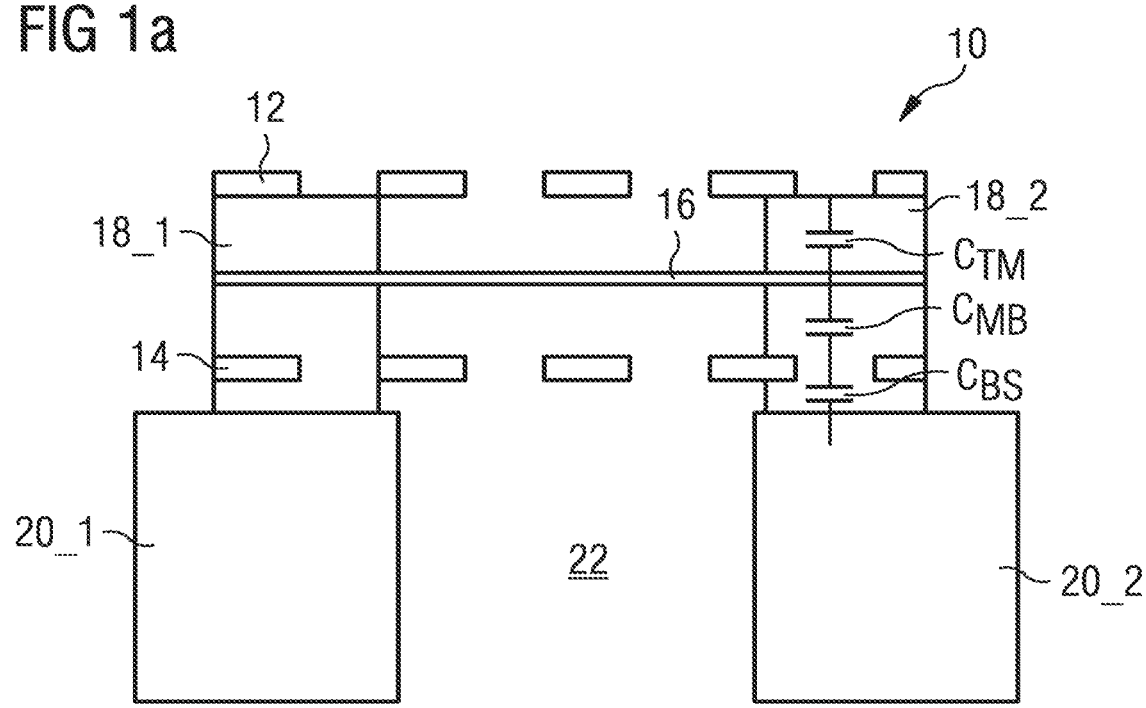
FIG. 1a shows a schematic MEMS device in cross-section.

Different embodiments of the teachings disclosed herein will subsequently be discussed referring to FIG. 1 to FIG. 10p. In the drawings, identical reference numerals are provided to objects having identical or similar functions so that objects referred to by identical reference numerals within the different embodiments are interchangeable and the description is mutually applicable.

DETAILED DESCRIPTION OF ILLUSTRATIVE EMBODIMENTS

Referring to FIG. 1a, a MEMS device 10 comprises a backplate electrode 12 and a second backplate electrode 14 being arranged in parallel to each other. Some implementation examples (e.g., so called single backplate microphones) may not comprise the second backplate electrode 14, i.e., the second backplate electrode 14 may be optional. The backplate electrode 12 may also be referred to as the top backplate electrode. The second backplate electrode 14 may also be referred to as the bottom backplate electrode. The attributes "top" and "bottom" mainly serve to distinguish the two backplate electrodes 12 and 14 regarding their graphical representation in FIG. 1a and possibly further figures, and should not to be construed as limiting. In the following description and figures, the index "T" typically refers to the top backplate electrode 12, the index "B" typically refers to the bottom backplate electrode 14, the index "M" typically refers to the membrane 16, and the index "S" typically refers to the substrate 20_1, 20_2. The MEMS device 10 further comprises a membrane 16. The membrane 16 is disposed between the backplate electrode 12 and the second backplate electrode 14 in parallel. The membrane 16 can comprise a displaceable portion and a fixed portion. The displaceable portion may be able to move in response to an incident sound wave. For example, the displaceable portion may be deflected or deformed. Alternatively, the displaceable portion may be displaced by a translation. The backplate electrode 12, second backplate electrode 14 and membrane 16 can comprise electrical conductive material.

The backplate electrode 12, the second backplate electrode 14 and the membrane 16 may be supported by a support structure 18_1, 18_2. The material of the support structure 18_1, 18_2 can be made of oxide. The support structure 18_1, 18_2 itself may be supported on a substrate 20_1, 20_2.

The backplate electrode 12 may comprise perforations to allow sound pressure to pass through the backplate electrode 12 to arrive at the membrane 16. The second backplate electrode 14 may be arranged on the side of the membrane 16 facing away from the direction of sound pressure arrival. Some of the air in the gap between the membrane 16 and the second backplate 14 may be pushed by the membrane 16 when moved as a consequence of sound pressure arrival. To allow the volume between the membrane 16 and the second backplate electrode 14 to escape, the second backplate electrode 14 may be provided with perforations as well. A backside cavity 22 may be provided allowing the air volume to expand which is pushed by the membrane 16.

The MEMS device 10 may suffer from parasitic capacitances created inside the support structure 18_1, 18_2. As shown in FIG. 1a, a first parasitic capacitance $C_{TM}$ may be observed in at least a portion of the support structure 18_1, 18_2 between the backplate electrode 12 and the membrane 16. A second parasitic capacitance $C_{MB}$ may be observed in at least a portion of the support structure 18_1, 18_2 between the membrane 16 and the second backplate electrode 14. A further parasitic capacitance $C_{BS}$ may be observed in at least a portion of the support structure 18_1, 18_2 between the second backplate electrode 14 and the substrate 20_1, 20_2. While not mentioned, further parasitic capacitances can be observed in specific portions of the support structure 18_1, 18_2 between different ones of the backplate electrode 12, the membrane 16 and the second backplate electrode 14.

Figure 1B:
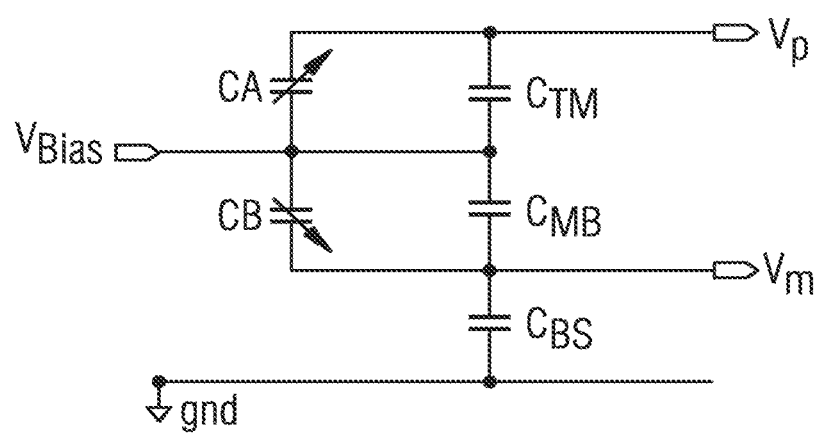

FIG. 1b shows a schematic circuit diagram of the MEMS device depicted in FIG. 1a. The substrate may be grounded. The membrane may be biased by a bias voltage $V_{bias}$. A voltage level Vp of the electrically conductive top backplate electrode 12 may be output. Further, a voltage level Vm of the electrically conductive (bottom) second backplate electrode 14 may be output. The voltage level outputs Vp and Vm vary in relation to the movement of the voltage biased membrane 16.

In other words, the MEMS device may be able to produce output signals Vp and Vm responsive to the movement of the membrane in relation to the backplate electrode and the second backplate electrode (refer to FIG. 1a). This feature is schematically indicated by variable capacitors CA and CB, also referred to as active capacitances CA and CB. The active capacitances CA, CB are variable in relation to the movement of the membrane in relation to the backplate electrode and the second backplate electrode, respectively.

The circuit diagram shown in FIG. 1b further indicates parasitic capacitances $C_{TM}$, $C_{MB}$ and $C_{BS}$ observed in specific portions of the support structure between different ones of at least the backplate electrode 12, the membrane 16, the second backplate electrode 14 and the substrate 20_1, 20_2.

Figure 2A:
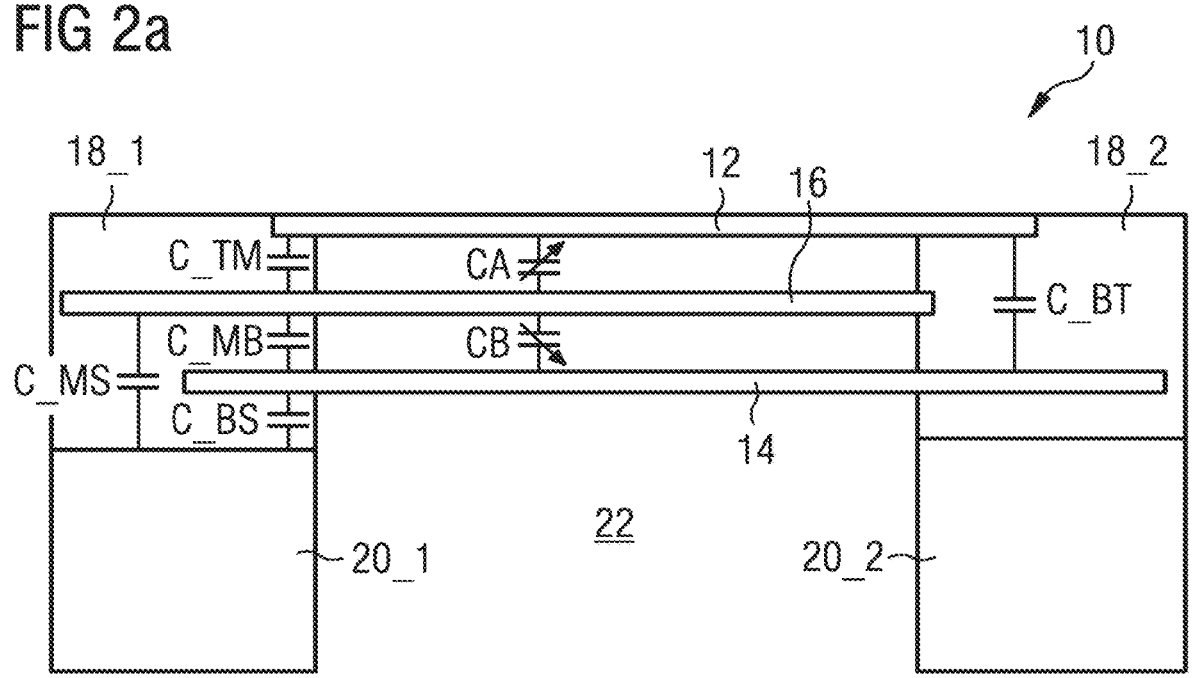
FIG. 2a shows a further schematic MEMS device in cross-section.

FIG. 2a shows a schematic diagram of a MEMS device 10 in a cross-sectional view. This schematic diagram differs from the schematic diagram shown in FIG. 1a in that further parasitic capacitances C_MS and C_BT may be observed inside the support structure 18_1 and 18_2. The parasitic capacitance C_MS may be observed inside portions of the support structure 18_1 disposed between the membrane 16 and the substrate 20_1. The parasitic capacitance C_BT may be observed between the second backplate electrode 14 and the backplate electrode 12 in portions of the support structure 18_2 disposed between the second backplate electrode 14 and the backplate electrode 12. Variable active capacitances CA and CB are observed between the membrane 16 and the backplate electrode 12 and the second backplate electrode 14, respectively.

Figure 2B:
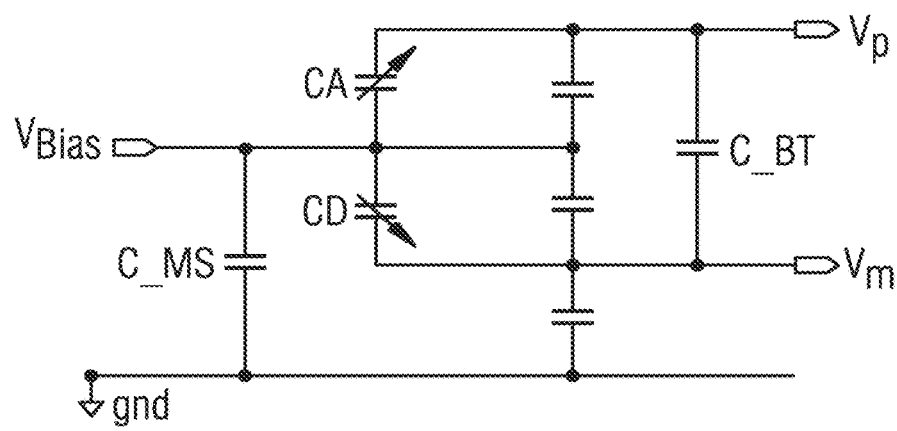

FIG. 2b shows a schematic circuit diagram of the MEMS device 10 comprising the further parasitic capacitances C_MS, C_BT. In this circuit diagram, the parasitic capacitance C_MS may be observed between the input bias voltage $V_{bias}$ and ground gnd. Further, the parasitic capacitance C_BT may be observed between the voltage level outputs Vp and Vm. Variable active capacitances CA and CB are observed between the membrane and the backplate electrode and the second backplate electrode, respectively (refer to FIG. 2a). The membrane is movable in relation to both the backplate electrode and the second backplate electrode.

Hence, active capacitances CA and CB vary in relation to this membrane movement, generated by sound pressure arrival, etc., for example.

Referring back to FIG. 2a and in comparison with FIG. 1a, the support structure 18_1 may comprise a portion disposed between the membrane 16 and the substrate 20_1 having no second backplate electrode 14 interposed. Hence, in said portion the parasitic capacitance C_MS may be provided between the membrane 16 and the substrate 20_1 directly. Further, the support structure 18_2 may comprise a portion between the backplate electrode 12 and the second backplate electrode 14 having no membrane 16 interposed. Hence, in said portion the parasitic capacitances C_BT may be provided between the backplate electrode 12 and the second backplate electrode 14 directly.

FIG. 3a shows a plan view of a MEMS device 10, and FIG. 3b shows the MEMS device 10 in cross-section in a schematic view. In contrast to the schematic view depicted in FIG. 2a, the backplate electrode 12, the membrane 16 and the second backplate electrode 14 may have all substantially same dimensions and may be stacked in relation to each other substantially without any offset. In other words, the backplate electrode 12, the membrane 16 and the second backplate electrode 14 may be arranged such to achieve maximum overlapping. This arrangement can be regarded as a worst case situation, since parasitic capacitances C_TM, C_MB and C_BS may be high compared to the arrangements depicted in FIGS. 1a and 2a. For example, parasitic capacitance C_TM may be about 1.0 pF, parasitic capacitance C_MB may be about 1.0 pF and parasitic capacitance C_BS may be about 4.1 pF. Since the membrane 16 is fully disposed between the backplate electrode 12 and the second backplate electrode 14, the parasitic capacitance C_BT can be regarded as negligible. Further, since the second backplate electrode 14 is disposed fully between the membrane 16 and the substrate 20_1, 20_2, the parasitic capacitance C_MS can be regarded as negligible, too.

Figure 4B:
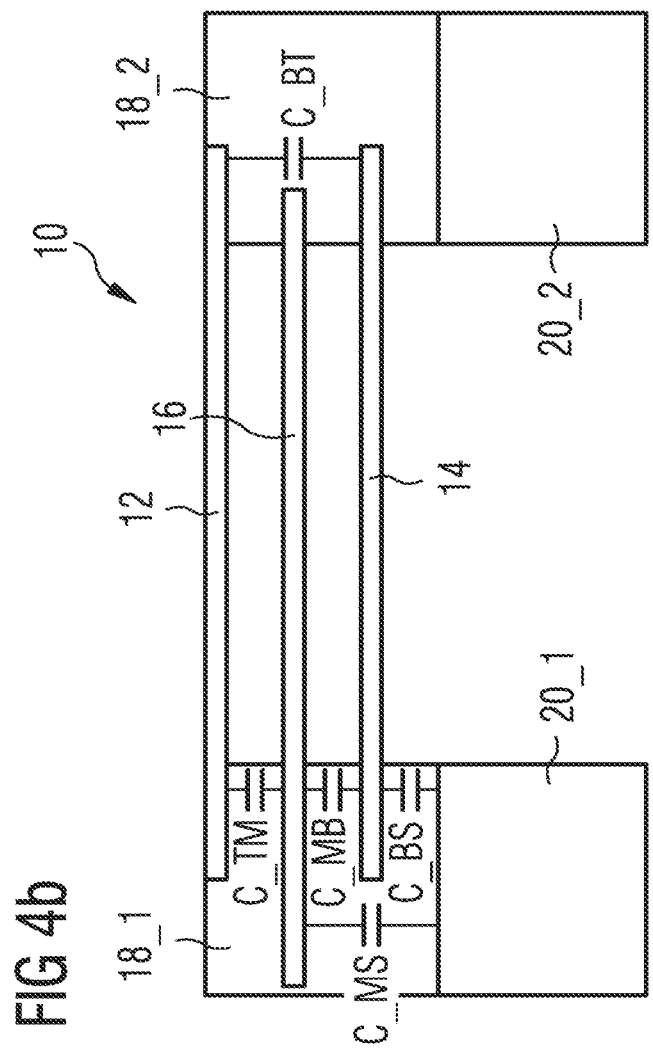
Figure 4A:
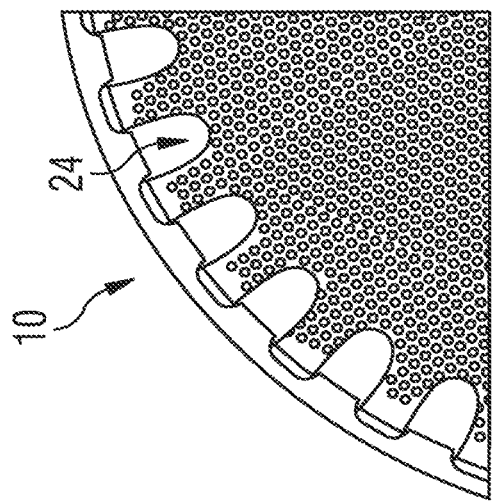
FIG. 4a shows a further plan view of a MEMS device.

FIG. 4a shows a MEMS device 10 in a plan view, and FIG. 4b shows a schematic diagram of the MEMS device 10 depicted in FIG. 4a in a cross-sectional view. In this arrangement, as can be best seen in FIG. 4a, the circumference of the backplate electrode 12 may comprise recesses 24. The recesses 24 may be arranged along the circumference of the backplate electrode 12 in an equidistant manner. While not shown in FIG. 4a, also the second backplate electrode can comprise a circumference provided with recesses, wherein the recesses can be arranged along the circumference in an equidistant manner (or uniformly), too. Further, while not shown in FIG. 4a, also the membrane 16 can comprise a circumference provided with recesses, wherein the recesses can be arranged along the circumference in an equidistant manner, as well. The recesses mentioned above are adapted to reduce the overlapping area in relation to each other.

Referring to FIG. 4b, this arrangement is likely to achieve reduced parasitic capacitances C_TM, C_MB and C_BS as well as reduced parasitic capacitances C_BT and C_MS, compared to parasitic capacitances created in the support structure of MEMS devices schematically shown in FIGS. 1a, 2a and 3b. For example, parasitic capacitance C_TM is 0.12 pF, parasitic capacitance C_MB is 0.12 pF and parasitic capacitance C_BS is 0.82 pF.

Compared to the arrangement shown in FIG. 3b, these parasitic capacitances are all reduced. In the MEMS device 10 as shown in FIG. 4b, in the support structure 18_2, portions of the backplate electrode 12 and the second backplate electrode 14 may be overlapped, without having the membrane 16 interposed. Hence, in this portion of the support structure 18_2 between the backplate electrode 12 and second backplate electrode 14, parasitic capacitance C_BT is created. However, this parasitic capacitance C_BT is reduced when compared to the arrangement shown in FIG. 3b, for example. In the arrangement shown in FIG. 4b, in the support structure 18_1, a portion of the membrane 16 projects beyond the backplate electrode 12 and second backplate electrode 14. In this configuration, parasitic capacitance C_MS is created in such portions of the support structure 18_1 having no second backplate electrode 14 interposed. However, this parasitic capacitance C_MS may be as small as 0.25% C_BS in some implementation examples.

Figure 5A:
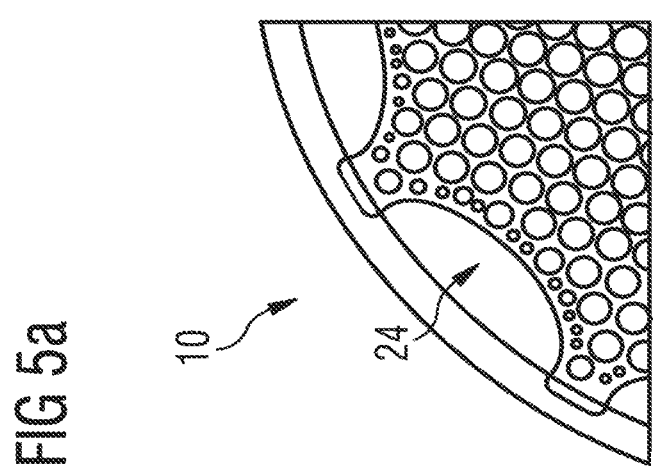
FIG. 5a shows a further plan view of a MEMS device.
Figure 5B:
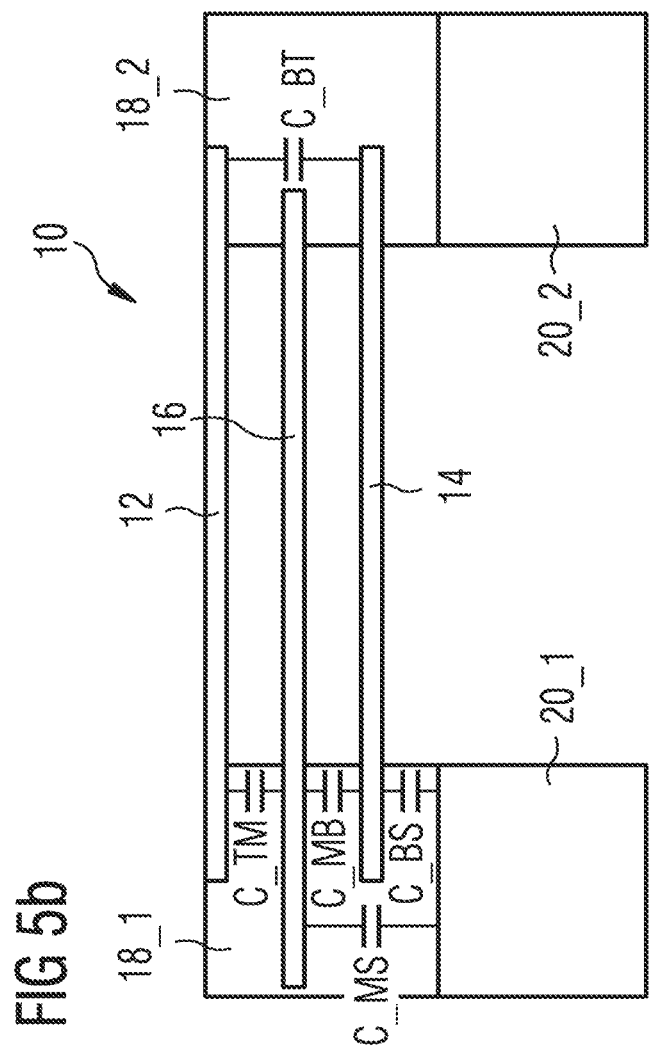

FIG. 5a shows a MEMS device 10 in a plan view, and FIG. 5b shows a schematic diagram of the MEMS device 10 depicted in FIG. 5a in a cross-sectional view. In this arrangement, as can be best seen in FIG. 5a, the circumference of the backplate electrode 12 may comprise recesses 24. The recesses 24 may be arranged along the circumference of the backplate electrode 12 uniformly or in an equidistant manner. Compared to the arrangement shown in FIG. 4a, the recesses 24 may be structured to comprise a larger radius of curvature. While not shown in FIG. 5a, also the second backplate electrode can comprise a circumference provided with recesses, wherein the recesses can be arranged along the circumference uniformly or in an equidistant manner. Further, while not shown in FIG. 5a, also the membrane can comprise a circumference provided with recesses, wherein the recesses can be arranged along the circumference in an equidistant manner.

Referring to FIG. 5b, this arrangement may provide reduced parasitic capacitances C_TM, C_MB and C_BS as well as reduced parasitic capacitances C_BT and C_MS compared to parasitic capacitances created in the support structure of MEMS devices schematically shown in FIGS. 1a, 2a, 3b and 4b. For example, parasitic capacitance C_TM may be about 0.5 pF, parasitic capacitance C_MB may be about 0.5 pF and parasitic capacitance C_BS may be about 0.3 pF.

Compared to the arrangement shown in FIG. 3b, for example, these parasitic capacitances may be reduced. In the MEMS device 10 as shown in FIG. 5b, in the support structure 18_2, portions of the backplate electrode 12 and the second backplate electrode 14 may overlap, without having the membrane 16 interposed. Hence, in this portion of the support structure 18_2 between the backplate electrode 12 and second backplate electrode 14, parasitic capacitance C_BT is created. However, this parasitic capacitance C_BT can be considered negligible. In the arrangement shown in FIG. 5b, in the support structure 18_1, a portion of the membrane 16 may project beyond the backplate electrode 12 and the second backplate electrode 14. In this configuration, parasitic capacitance C_MS may be created in such portions of the support structure 18_1 having no second backplate electrode 14 interposed. However, this parasitic capacitance C_MS may be as small as about 0.25% C_BS.

FIG. 6 shows a MEMS device 10 in a cross-sectional view. In general, this MEMS device 10 has substantially the same arrangement as compared to the MEMS devices depicted in FIGS. 4b and 5b. However, the MEMS device 10 shown in FIG. 6 comprises a backplate electrode 12 and a second backplate electrode 14 which comprise segmentations 12S and 14S. In particular, the backplate electrode 12 may comprise a segmentation 12S. Further, the second backplate electrode 14 may comprise a segmentation 14S. The MEMS device 10 further may comprise a membrane 16 disposed spaced apart from the backplate electrode 12 and the second backplate electrode 14. The membrane 16 may comprise a displaceable portion and a fixed portion. The fixed portion may be defined to comprise at least a portion of the membrane 16 fixed by the support structure 18_1, 18_2. The displaceable portion may be defined to comprise a portion of the membrane 16 being deflectable.

In the backplate electrode 12, the segmentation 12S may be arranged to provide an electrical isolation between an active backplate portion 12ABP and a further backplate portion 12FBP, the active backplate portion 12ABP facing the displaceable portion of the membrane 16. In the second electrode 14, the segmentation 14S is arranged to provide an electrical isolation between an active backplate portion 14ABP and a further backplate portion 14FBP, the active backplate portion 14ABP facing the displaceable portion of the membrane 16.

Variable active capacitances CA and CB are observed between the displaceable portion of the membrane 16 and the active backplate portion 12ABP of the backplate electrode 12 and the active backplate portion 14ABP of the second backplate electrode 14, respectively. Hence, active capacitances CA and CB vary in relation to the movement of the displaceable portion of the membrane 16 in relation to both the active backplate portion 12ABP of the backplate electrode 12 and the active backplate portion 14ABP of the second backplate electrode 14, respectively. This membrane 16 movement is generated by, for example, sound pressure arrival caused by speech, etc.

In case the MEMS device 10 comprises the backplate electrode 12, the membrane 16 and the second backplate electrode 14 having a circular shape, also the segmentations 12S and 14S may be formed circularly. The segmentations 12S and 14S may be arranged to extend in the vicinity of the support structure 18_1, 18_2 in order to segment the backplate electrode 12 and the second backplate electrode 14 into the active backplate portions 12ABP, 14ABP and the further backplate portion 12FBP, 14FBP. Summarized, the active backplate portions 12ABP and 14ABP may be central portions (medium portions) and the further backplate portions 12FBP and 14FBP may be fringe portions of each the backplate electrode 12 and the second backplate electrode 14.

The backplate electrode 12 and second backplate electrode 14 may be made of, or comprise, an electrically conductive material, for example poly-silicon. By the provision of the segmentations 12S, 14S, the parasitic capacitances may be reduced greatly since the isolated (separated) further backplate portions 12FBP, 14FBP do not contribute to the creation of parasitic capacitances. Each of the segmentations 12S, 14S can be regarded as a fringing capacitance C_F which limits the parasitic coupling. Hence, the capacitance of the MEMS device 10 as a whole may comprise an active capacitance CA created between the active backplate portion 12ABP of the backplate electrode 12 and the displaceable portion of the membrane 16, as well as an active capacitance CB created between the active backplate portion 14ABP of the second backplate electrode 14 and the displaceable portion of the membrane 16.

Note, that both the active backplate portion 12ABP of the backplate electrode 12 as well as the active backplate portion 14ABP of the second backplate electrode 14 may be connected to signal outputs via electrical conductive leadthroughs (not shown), respectively. The further backplate portion 12FBP of the backplate electrode 12 may be isolated in the immediate vicinity. Further, the further backplate portion 14FBP of the second backplate electrode 14 may be isolated in the immediate vicinity. Hence, parasitic capacitances C_TM, C_MB and C_BS may be substantially eliminated. Further, parasitic capacitances C_MS and C_BT may be substantially eliminated, too.

Both, the backplate electrode 12 as well as the second backplate electrode 14 may comprise bonding layers 12B, 14B, respectively. The bonding layers 12B, 14B may be arranged to support the active backplate portions 12ABP and 14ABP to the further backplate portions 12FBP and 14FBP. The bonding layers 12B, 14B may be arranged to pull the backplate electrode 12 and second backplate electrode 14 flat.

The material of the bonding layers 12B, 14B may comprise a dielectric material. For example, the dielectric material may comprise SiN. The bonding layers 12B, 14B may be bonded to surfaces of the backplate electrode 12 and the second backplate electrode 14, respectively, facing each other. This feature may provide a symmetrization. In another example, the bonding layers 12B, 14B can be bonded to surfaces of the backplate electrode 12 and the second backplate electrode 14, respectively, facing opposite directions. This feature may provide a symmetrization, as well. It may also be possible that the backplate electrode 12 is bonded to a surface of the bonding layer 12B, and that the second backplate electrode 14 is bonded to a surface of the bonding layer 14B.

FIG. 7 shows a plan view of the backplate electrode 12 or 14 (backplate electrode 12 or second backplate electrode 14). This backplate electrode 12 or 14 may comprise the active backplate portion 12ABP or 14ABP (medium portion) surrounded by the further backplate portion 12FBP or 14FBP (fringe portion). Both portions may be isolated (separated) from each other via the segmentation 12S or 14S. A bonding layer 12B or 14B may be provided to bond the active backplate portion 12ABP or 14ABP to the further backplate portion 12FBP or 14FBP which may be itself supported circumferentially by means of a support structure (not shown). A lead-through 26 may be provided which connects the active backplate portion 12ABP or 14ABP to a pad 28 serving as a contact point. Due to the segmentation 12S or 14S, the further backplate portion 12FBP or 14FBP may be completely isolated from the pad 28 and vice versa. The backplate electrode 12 or 14 may be perforated to allow transmission of sound pressure to the membrane (not shown) in case the backplate electrode is embodied as top backplate electrode.

Figure 8B:
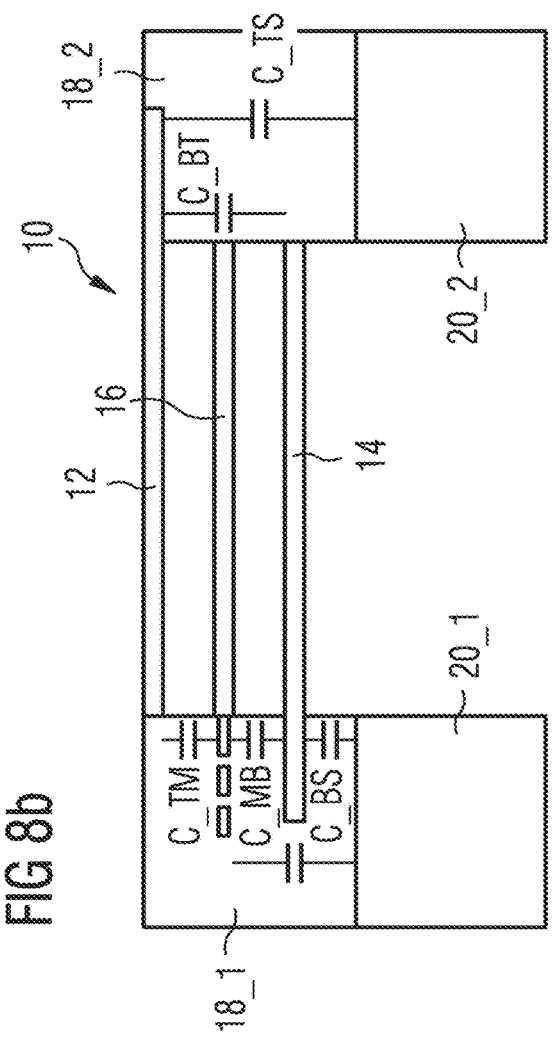
Figure 8A:
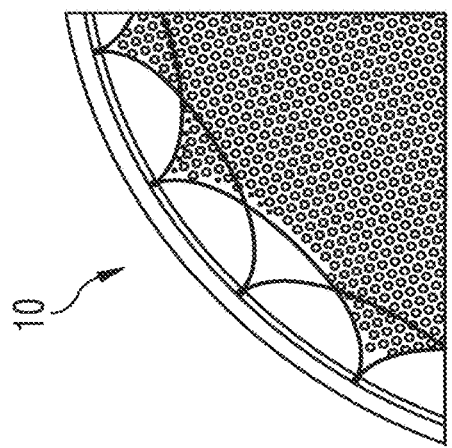
FIG. 8a shows a further plan view of a MEMS device.

FIG. 8a shows a MEMS device 10 in a plan view and FIG. 8b shows the MEMS device 10 in a cross-sectional view. In this arrangement, the circumferences of the backplate electrode 12, the membrane 16 and the second backplate electrode 14 may be formed such to comprise recesses adapted to, in the support structure, reduce overlapping areas in relation to each other. The recesses are arranged along the circumferences in an equidistant manner.

Further, the backplate electrode 12, the second backplate electrode 14 and the membrane 16 may comprise the same number of recesses. Furthermore, the recesses of the top backplate electrode 12, the bottom backplate electrode 14 and the membrane 16, respectively, may be arranged such to be offset to each other angularly.

FIG. 8b shows a cross-sectional view of the MEMS device 10. In this configuration, the backplate electrode 12, the membrane 16 and the second backplate electrode 14 may comprise recesses. This configuration allows for reduced parasitic capacitances. In particular, the parasitic capacitance C_TM, created inside the support structure 18_1 (i.e., the capacitance between the fixed portion of the membrane 16 and the corresponding portion of the top backplate electrode 12) equals about 0.0 pF, since the backplate electrode 12 and the membrane 16 do not overlap inside the support structure 18_1. Further, the parasitic capacitance C_MB created inside the support structure 18_1 equals about 0.0 pF, since the membrane 16 and the second backplate electrode 14 do not overlap inside the support structure 18_1, as well. In other words, the fixed portion of the membrane 16 does not (or only little) overlap with the corresponding portion of the second backplate electrode 14. The portions of the backplate electrode 12 and of the second backplate electrode 14 that correspond to the fixed portion of the membrane 16 may be regarded as the clamped portions of the backplate electrode 12, 14, as opposed to their exposed portions which may correspond substantially to the displaceable portion of the membrane 16. Further, the parasitic capacitance C_BS created between the second backplate electrode 14 and the substrate 20_1 equals about 0.58 pF.

In addition, the parasitic capacitance C_BT created between the backplate electrode 12 and the second backplate electrode 14 may be negligible. Further, the parasitic capacitance C_MS may equal about 25% of C_BS. Furthermore, the parasitic capacitance C_TS created between the backplate electrode 12 and the substrate 20_2, inside the support structure 18_2, may equal about 14% of C_BS. Hence, parasitic capacitances typically may be reduced significantly.

Figure 8C:
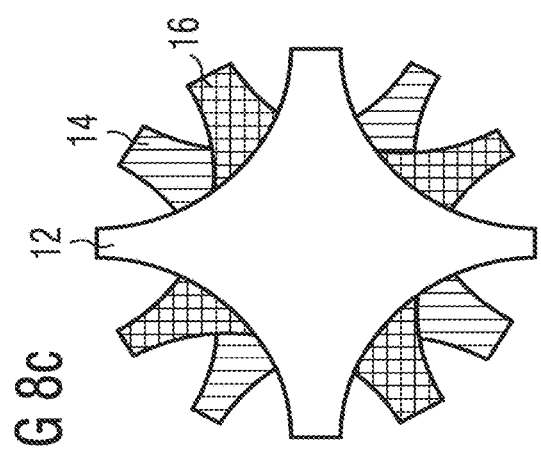
FIG. 8c shows in a schematic diagram a plan view of the arrangement of a top backplate electrode, a membrane and a bottom backplate electrode in relation to each other.

For a better overview, FIG. 8c shows the angular offset arrangement between the backplate electrode 12, the second backplate electrode 14 and the membrane 16 in a schematic view. In this case, the second backplate electrode 14 is offset from the backplate electrode 12 by an angular offset of 30°. Further, the membrane 16 is offset from the second backplate electrode 14 by an angular offset of 30°.

Due to this arrangement the backplate electrode 12, the second backplate electrode 14 and the membrane 16 may be arranged such that in an area corresponding to the fixed portion (i.e., inside the support structure) of the membrane 16 the overlapping area in relation to each other exhibits substantially minimum overlapping. Further, the membrane 16 may be arranged such that in the fixed portion the overlapping area in relation to both the backplate electrode 12 and second backplate electrode 14 may be less than maximum overlapping. Furthermore, the angular offsets of the recesses of the backplate electrode 12, the second backplate electrode 14 and the membrane 16 may comprise a value resulting in minimum overlapping with each other. Furthermore, the backplate electrode 12, the second backplate electrode 14 and the membrane 16 may be arranged such that in an area corresponding to the displaceable portion of the membrane 16 (e.g., central portion of the membrane) the overlapping area in relation to each other exhibits substantially maximum overlapping.

The recesses can be shaped to have a semi-circular shape, a circle segment shape, a castellation shape or other shape.

Figure 9A:
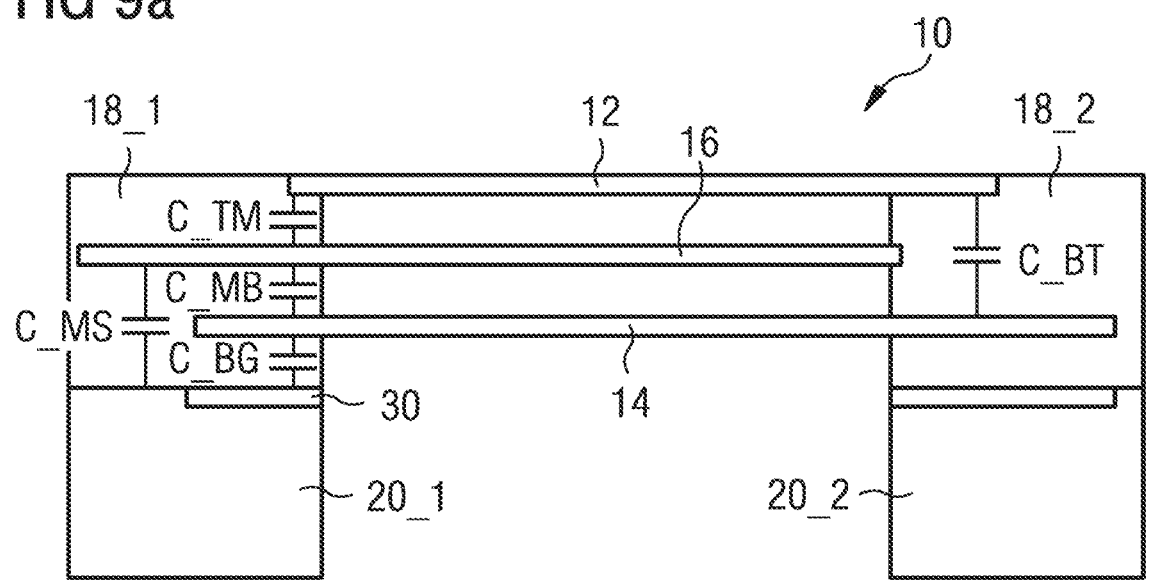
FIG. 9a shows in a cross-sectional view a schematic diagram of a MEMS device comprising a guard ring.

FIG. 9a shows a schematic diagram of a MEMS device 10 in a cross-sectional view. Similar to the arrangements shown in FIGS. 4b, 5b, 6 and 8b, the backplate electrode 12, the membrane 16 and the second backplate electrode 14 may be arranged such that an overlapping area of the fixed portion of the membrane 16 with the backplate electrodes 12, 14 is less than maximum overlapping. In the MEMS device 10 in the arrangement shown in FIG. 9a, a guard ring 30 may be interposed between the substrate 20_1, 20_2 and the support structure 18_1, 18_2. The guard ring 3o may be associated with the second backplate electrode 14 and adapted to reduce parasitic capacitance in the support structure 18_1, 18_2 (i.e., fixed portion of the membrane 16 with the backplate electrodes 12, 14). In particular, the guard ring 30 may be adapted to reduce parasitic capacitances between the second backplate electrode 14 and the guard ring 30 itself. The guard ring 30 may be interposed circumferentially.

Figure 9B:
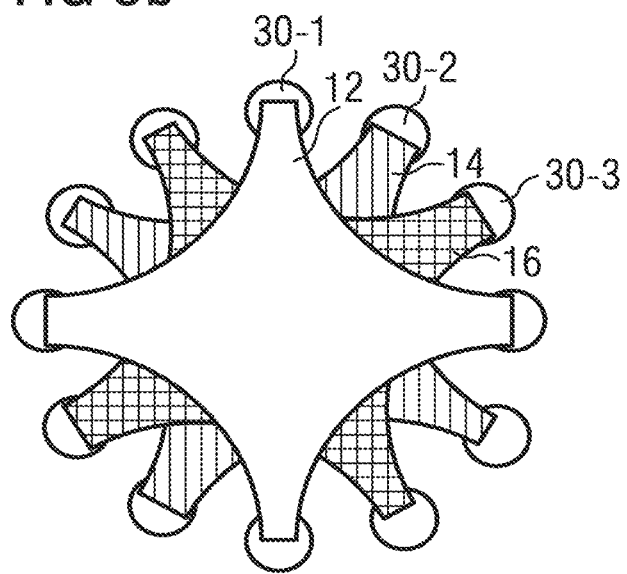
FIG. 9b shows in a schematic diagram a plan view of the arrangement of a top backplate electrode, a membrane, a bottom backplate electrode and associated guard rings in relation to each other.

Further, as depicted in FIG. 9b, additional guard rings 30_1 to 30_3 can be provided, wherein each guard ring is associated with the backplate electrode 12, the membrane 16 and the second backplate electrode 14, respectively. In particular, each guard ring 30_1 to 30_3 may be associated with one protruding arm of the backplate electrode 12, the membrane 16, or the second backplate electrode 14, wherein each protruding arm may mechanically connect a corresponding central portion (e.g., a suspended portion) of the backplate electrode 12, the membrane 16, and the second backplate electrode 14, respectively, with the support structure. In this case, each guard ring 30_1 to 30_3 may be associated with the respective one of the backplate electrode 12, the membrane 16 and the second backplate electrode 14. Due to the provision of the guard rings 30_1 to 30_3, large reductions in parasitic capacitances can be achieved.

Figure 10A:
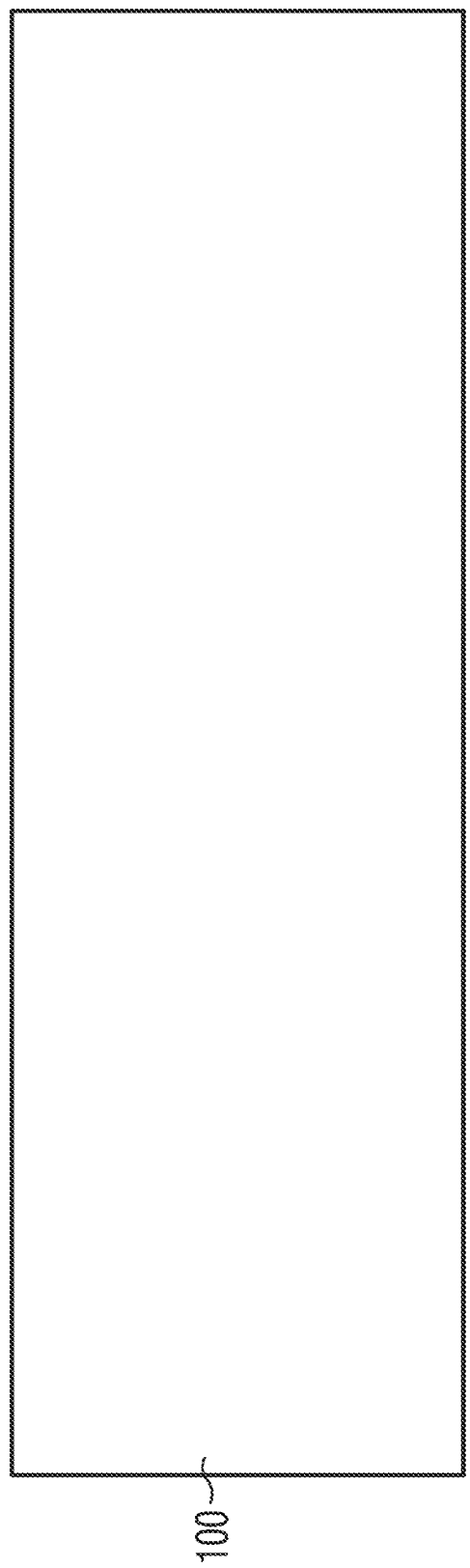

FIGS. 10a to 10p show schematic cross-sections associated during various stages or steps of an example manufacturing process of a MEMS device as described above.

FIG. 10a shows the substrate 100 which can be made of a silicon wafer.

As shown in FIG. 10b, a lower etch stop layer 102 is deposited onto the upper surface of the substrate 100. The lower etch stop layer 102 may provide a reliable stop of an etching process. The lower etch stop layer 102 may typically be made from a stop oxide TEOS (tetraethyl orthosilicate). The thickness of the lower etch stop layer 102 may be typically about 600 nm.

FIG. 10c shows a schematic cross-sectional view of the arrangement upon depositing a SiN layer 104 onto the surface of the lower etch stop layer 102 and upon depositing a poly-silicon layer 106 onto the surface of the deposited SiN layer 104. The SiN layer 104 may have a thickness of about 140 nm. The poly-silicon layer 106 may have a typical thickness of about 330 nm.

FIG. 10d shows a schematic cross-sectional view after a multilayer arrangement comprising the three layers 102, 104 and 106 have been deposited onto the substrate 100 and the poly-silicon layer 106 has been structured, for example by etching, to provide a poly-silicon layer 106 segmentation.

FIG. 10e shows a schematic cross-sectional view after a multilayer arrangement comprising the SiN layer 104, poly-silicon layer 106 and a further SiN layer 108 has been structured. In particular, openings or trenches may be formed in the multilayer arrangement, wherein said openings extend to the oxide layer 102.

FIG. 10f shows a schematic cross-section after filling the whole substrate 100 surface with a TEOS deposition layer no by means of a deposition process, for example. In particular, the TEOS deposition layer no may have been filled into the openings. Afterwards, the TEOS layer no may have been annealed. A chemical mechanical polishing (CMP) process may have been applied to the TEOS layer no, subsequently.

FIG. 10g shows a schematic cross-sectional view of the arrangement after a further TEOS layer 112 may have been applied on top of the polished TEOS layer 110. Afterwards, this TEOS layer 112 may have also been annealed.

FIG. 10h shows a schematic cross-sectional view of the arrangement after the additional TEOS layer 112 may have been subjected to a process of forming recesses 114. The recesses 114 may be used for a subsequent formation of anti-sticking bumps. The anti-sticking bumps may be arranged to reduce the risk that a membrane element (not shown) gets stuck to an underlying electrode due to an adhesive force. The anti-sticking bumps 114 may be formed by etching, for example.

FIG. 10i shows a schematic cross-sectional view of the arrangement after a membrane layer 116 may have been deposited onto the TEOS layer 112. In particular, the membrane layer 116 may have been deposited onto the TEOS layer 112 to fill the recesses 114 in order to form respective anti-sticking bumps. The membrane layer 116 may have a thickness of about 330 nm and comprises poly-silicon, for example.

FIG. 10j shows a schematic cross-sectional view of the arrangement after a TEOS layer 118 may have been deposited on top of the TEOS layer 112 as well as on top of the membrane layer 116. After deposition of the TEOS layer 118, this layer is etched to form recesses 120 to be used for a subsequent formation of anti-sticking bumps in the (top) backplate electrode 12.

FIG. 10k shows a schematic cross-sectional view of the arrangement after a bonding layer 122 may have been deposited on top of the TEOS layer 118. The bonding layer 122 may comprise SiN. The bonding layer 122 may be deposited such to fill the whole surface as well as the recesses 120 for obtaining respective anti-sticking bumps (refer to FIG. 10j). After this process, a poly-silicon layer 124 may be deposited on top of the SiN layer 122. Subsequently, the poly-silicon layer 124 may be segmented, for example, by etching.

FIG. 10l shows a schematic cross-sectional view of the arrangement after deposition of a SiN layer 126 on top of the arrangement shown in FIG. 10k. In particular, the SiN layer 126 may be deposited on top of the poly-silicon layer 124. After deposition of the SiN layer 126, this layered arrangement comprising the SiN layer 122, the poly-silicon layer 124 and the SiN layer 126 may be etched to form a plurality of openings or trenches, which extend to the TEOS layer 118.

FIG. 10m shows a schematic cross-sectional view of the arrangement after deposition of a TEOS layer 128 on top of the layered arrangement comprising the SiN layer 122, the poly-silicon layer 124 and the SiN layer 126 as mentioned above. The TEOS layer 128 has a thickness of 100 nm, for example.

Subsequent to this process, a contact hole 130 may be formed by means of photolithography. This contact hole 130 may be formed to extend across the SiN layer 126 and the TEOS layer 128 until reaching the poly-silicon layer 124. Further, as shown on the right-hand side of FIG. 10m, first to third trenches 132, 134 and 136 may be formed such to extend across respective TEOS layers of the TEOS layers 110, 112, 118.

In particular, the first trench 132 may be formed to extend across the TEOS layer 118 such to reach the membrane layer 116 (refer to FIG. 10p. Further, the second trench 134 may be formed to extend across the TEOS layers 118 and 112 such to reach the poly-silicon layer 106 (refer to FIG. 10e). Further, the third trench 136 may be formed to extend across the TEOS layers 110, 112 and 118, as well as the lower etch stop layer 102 such as to reach the substrate 100.

FIG. 10n shows a schematic cross-sectional view of the arrangement after filling of electrically conductive material into the contact hole 130 and into the first to third trenches 132, 134 and 136. In doing so, contacts 138, 140, 142 and 144 may be created, connected to surface-mounted pads 146, 148, 150 and 152, respectively.

In particular, the contacts 138, 14o, 142 and 144 may be formed such that the respective contact pads 146, 148, 150 and 152 may be electrically connected to the respective layers, respectively, i.e., the poly-silicon layer 124, the membrane layer 116, the poly-silicon layer 106 and the substrate 100. In general, connections may be created to achieve electrical connections to the second backplate electrode, the membrane, the backplate electrode and the substrate, respectively. The material of the contacts 138, 14o, 142 and 144 can be titanium, platinum, or gold, for example. Of course, other materials having good electrical conductivity can be selected.

FIG. 10o shows a schematic cross-sectional view of the MEMS device 10 after backside etching of a backside cavity 154. In this etching step, the lower etch stop layer 102 may act as an etch stop element preventing the etching agent to reach the second backplate electrode.

FIG. 10p shows a schematic cross sectional view of the MEMS device 10 after removal of parts of the TEOS layers 110, 112 and 118 inside operation portions of the backplate/membrane/backplate-arrangement. This step may be assisted by a front side protection mask opening the perforations of the backplate electrode.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

What is claimed is:

1. A method, comprising:
   depositing an etch stop layer over a substrate;
   depositing a first nitride layer over the etch stop layer;
   depositing a first electrically conductive layer over the first nitride layer;
   depositing a second nitride layer over the first electrically conductive layer, wherein the first nitride layer, the first electrically conductive layer, and the second nitride layer form a first multilayer arrangement;
   etching a plurality of first openings in the first multilayer arrangement to expose an upper surface of the etch stop layer;
   depositing a first oxide layer into the plurality of first openings and over the first multilayer arrangement;
   depositing a second electrically conductive layer over the first oxide layer;
   depositing a second oxide layer over the first oxide layer and over the second electrically conductive layer;
   depositing a third nitride layer over the second oxide layer;
   depositing a third electrically conductive layer over the third nitride layer;
   depositing a fourth nitride layer over the third electrically conductive layer, wherein the third nitride layer, the third electrically conductive layer, and the fourth nitride layer form a second multilayer arrangement;
   etching a plurality of second openings in the second multilayer arrangement to expose an upper surface of the second oxide layer;

forming a backside cavity in the substrate; and
removing portions of the etch stop layer, the first oxide layer, and the second oxide layer that are disposed over the backside cavity.

2. The method of claim 1, wherein a thickness of the etch stop layer is about 600 nm.

3. The method of claim 1, wherein the first electrically conductive layer, the second electrically conductive layer, and the third electrically conductive layer comprise polysilicon.

4. The method of claim 1, wherein an overlapping area of a fixed portion of the second electrically conductive layer with the first electrically conductive layer is less than a maximum overlapping.

5. The method of claim 1, further comprising:
forming a first contact extending through the second oxide layer and contacting the second electrically conductive layer;
forming a second contact extending through the second oxide layer and the second nitride layer and contacting the first electrically conductive layer; and
forming a third contact extending through the second oxide layer and first oxide layer and contacting the substrate.

6. The method of claim 1, wherein the second electrically conductive layer forms a deflectable membrane of a MEMS microphone.

7. The method of claim 6, wherein the first electrically conductive layer and the third electrically conductive layer respectively form a first perforated electrode and a second perforated electrode of the MEMS microphone.

8. The method of claim 1, further comprising:
before depositing the second nitride layer, etching portions of the first electrically conductive layer to expose the first nitride layer to form a segmented first electrically conductive layer.

9. The method of claim 8, wherein a first portion of the segmented first electrically conductive layer is electrically isolated from a second portion of the segmented first electrically conductive layer.

10. The method of claim 1, further comprising:
before depositing the fourth nitride layer, etching portions of the third electrically conductive layer to expose the third nitride layer to form a segmented third electrically conductive layer.

11. The method of claim 10, wherein a first portion of the segmented third electrically conductive layer is electrically isolated from a second portion of the segmented third electrically conductive layer.

12. A method, comprising:
depositing a first electrically conductive layer over a first nitride layer disposed over a substrate;
etching portions of the first electrically conductive layer to expose the first nitride layer, wherein a segmented first electrically conductive layer is formed;
depositing a second nitride layer over the first electrically conductive layer and the exposed first nitride layer, wherein the first nitride layer, the first electrically conductive layer, and the second nitride layer form a first multilayer arrangement;
depositing a first oxide layer over the first multilayer arrangement;
depositing a second electrically conductive layer over the first oxide layer;
depositing a second oxide layer over the first oxide layer and over the second electrically conductive layer;
depositing a third nitride layer over the second oxide layer;
depositing a third electrically conductive layer over the third nitride layer;
etching portions of the third electrically conductive layer to expose the third nitride layer, wherein an segmented third electrically conductive layer is formed;
depositing a fourth nitride layer over the third electrically conductive layer, wherein the third nitride layer, the third electrically conductive layer, and the fourth nitride layer form a second multilayer arrangement;
forming a backside cavity in the substrate; and
removing portions of the first oxide layer and the second oxide layer that are disposed over the backside cavity.

13. The method of claim 12, wherein the second conductive layer forms a membrane, the first conductive layer forms a first backplate, and the second conductive layer forms a second backplate.

14. The method of claim 13, wherein the membrane, first backplate and second backplate form a MEMS microphone.

15. The method of claim 12, further comprising:
etching a plurality of first openings in the first multilayer arrangement after depositing the second nitride layer; and
etching a second plurality of first openings in the second multilayer arrangement after depositing the fourth nitride layer.

16. A method comprising:
forming a first multilayer arrangement over a substrate, the first multilayer arrangement comprising a first polysilicon layer disposed between a first nitride layer and a second nitride layer;
depositing a first oxide layer over the first multilayer arrangement;
depositing a second polysilicon layer over the first oxide layer;
forming a second oxide layer over the second polysilicon layer;
forming a second multilayer arrangement comprising a third polysilicon layer disposed between a third nitride layer and a fourth nitride layer;
forming a backside cavity in the substrate; and
removing portions of the first oxide layer and the second oxide layer that are disposed over the backside cavity, wherein
forming the first multilayer arrangement comprises etching portions of the first polysilicon layer to expose the first nitride layer, and depositing the second nitride layer over the first polysilicon layer and the exposed portions of the first nitride layer to form a segmented first polysilicon layer, or
forming the second multilayer arrangement comprises etching portions of the third polysilicon layer to expose the third nitride layer, and depositing the third nitride layer over the third polysilicon layer and the exposed portions of the third nitride layer to form a segmented third polysilicon layer.

17. The method of claim 16, further comprising etching a plurality of first openings in the first multilayer arrangement after depositing the second nitride layer.

18. The method of claim 17, further comprising etching a second plurality of first openings in the second multilayer arrangement after depositing the fourth nitride layer.

19. The method of claim 16, wherein the second polysilicon layer forms a membrane, the first polysilicon layer forms a first backplate, and the second polysilicon layer forms a second backplate of a MEMS sensor.

20. The method of claim 19, wherein the MEMS sensor is a microphone.

* * * * *